US007907495B2

United States Patent
Iida et al.

(10) Patent No.: US 7,907,495 B2
(45) Date of Patent: Mar. 15, 2011

(54) TWO-DIMENSIONAL DIGITAL DATA ACQUISITION ELEMENT AND HOLOGRAPHIC STORAGE APPARATUS

(75) Inventors: Yoshinori Iida, Tokyo (JP); Hiroto Honda, Yokohama (JP); Akiko Hirao, Chiba (JP); Kazuki Matsumoto, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 419 days.

(21) Appl. No.: 12/109,633

(22) Filed: Apr. 25, 2008

(65) Prior Publication Data
US 2008/0267040 A1  Oct. 30, 2008

(30) Foreign Application Priority Data

Apr. 27, 2007 (JP) ................................ 2007-119437

(51) Int. Cl.
*G11B 7/00* (2006.01)
(52) U.S. Cl. ............. 369/103; 369/120; 369/124.12
(58) Field of Classification Search ............... 359/339, 359/559
See application file for complete search history.

(56) References Cited

U.S. PATENT DOCUMENTS

| | | | | |
|---|---|---|---|---|
| 5,886,659 | A * | 3/1999 | Pain et al. | 341/155 |
| 7,456,885 | B2 * | 11/2008 | Baker | 348/308 |
| RE41,730 | E * | 9/2010 | Fossum et al. | 341/162 |
| 2002/0126215 | A1 * | 9/2002 | Shigematsu et al. | 348/302 |

OTHER PUBLICATIONS

Mark Ayres et al., "Image oversampling for page-oriented optical data storage", Apr. 10, 2006, Applied Optics vol. 45, No. 11, pp. 2459-2464.

* cited by examiner

*Primary Examiner* — Joseph Haley
*Assistant Examiner* — Ifedayo Iluyomade
(74) *Attorney, Agent, or Firm* — Oblon, Spivak, McClelland, Maier & Neustadt, L.L.P.

(57) ABSTRACT

A two-dimensional digital data acquisition element includes: a pixel area having a plurality of pixels arranged in a matrix form, each of the pixels having a photoelectric conversion element to convert the reproduced light from the optical information recording medium to an electric signal; selection circuits which select the pixel; a readout circuit which reads out an electric signal of a pixel selected by the selection circuits; and a 1-bit AD converter which converts an output of the readout circuit to 1-bit digital data. A pitch ratio N between a pitch P1 of the unit data areas in the two-dimensional digital image information and a pitch P2 of the pixels in the pixel area defined as N=P1/P2 satisfies a relation $$A \cdot n^2/(An+1) < N < A \cdot n^2/(An-1)$$

where A is the number of digital data in one-dimensional direction of one byte of the two-dimensional digital data and n is a natural number of at least 2.

14 Claims, 20 Drawing Sheets

| ? | ? | ? | ? | SH | } FIRST ROW

| ? | SL   SL | ? | SH | } SECOND ROW

| ? | SL   SL | ? | SH | } THIRD ROW

| ? | ? | ? | ? | SH | } FOURTH ROW

| SH | SH | SH | SH | SH | } FIFTH ROW

FIRST COLUMN  SECOND COLUMN  THIRD COLUMN  FOURTH COLUMN  FIFTH COLUMN

FIG. 8

EXAMPLE 1: IN CASE WHERE OVERSAMPLING RATE DESIGN VALUE n = 3: INTEGER, AND DATA UNIT IN INPUT DATA IS ONE-DIMENSIONAL AND A = 8: INTEGER

RANGE IN WHICH CMOS PIXEL DEVIATION AMOUNTING TO ONE PIXEL DOES NOT OCCUR $2.88 < N < 3.13$
$\rightarrow 3 \times 24/25 < N < 3 \times 24/23$
$\rightarrow n \cdot 8n/(8n+1) < N < n \cdot 8n/(8n-1)$
$\rightarrow n \cdot A \cdot n/(An+1) < N < n \cdot A \cdot n/(An-1)$
$\rightarrow An^2/(An+1) < N < An^2/(An-1)$ (a) INPUT DATA: 8 Pix.   0 1 1 1 0 0 1 1   CMOS PIXEL (b) ACTUAL RATE N = 2.88   CMOS = 25 Pix.

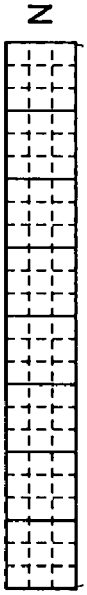
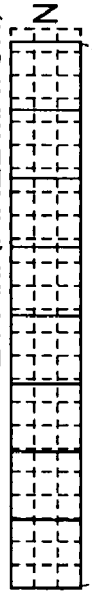

(c) N = 2.94   24.5 Pix.

(d) N = 3   24 Pix. (PIXEL MATCH)

(e) N = 3.06   23.5 Pix.

(f) N = 3.13   23 Pix.

FIG. 24

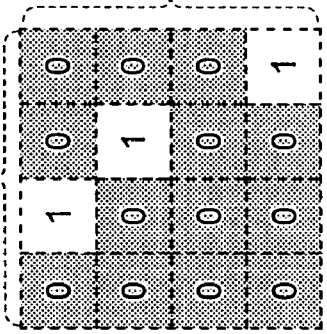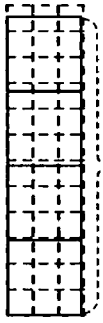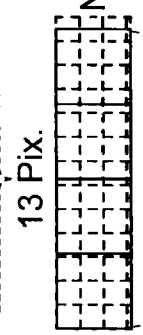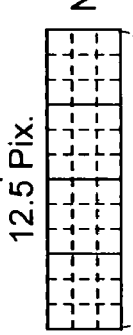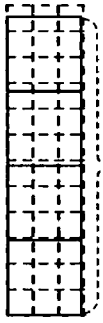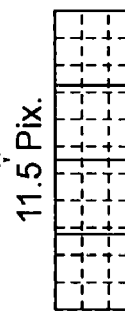
FIG. 25

TWO-DIMENSIONAL DIGITAL DATA ACQUISITION ELEMENT AND HOLOGRAPHIC STORAGE APPARATUS

CROSS-REFERENCE TO RELATED APPLICATION

This application is based upon and claims the benefit of priority from prior Japanese Patent Application No. 2007-119437 filed on Apr. 27, 2007 in Japan, the entire contents of which are incorporated herein by reference.

BACKGROUND OF THE INVENTION

1. Field of the Invention

The present invention relates to a two-dimensional digital data acquisition element and a holographic storage apparatus.

2. Related Art

A new optical disk system called holographic storage is proposed as a DVD (Digital Versatile Disc) in a generation after the next generation, and makers announcing officially its commercialization plans are also appearing (see, for example, H. J. Coufal, Holographic Data Storage (Sprihger, Berlin, 2000).

The holographic storage has a feature that a higher data density and fast readout are possible because a laser having a short wavelength of approximately 400 nm is used and two-dimensional digital data encoded in the holographic layer at high density as interference fringes are read fast.

The two-dimensional image data acquisition element is required to have an extremely high frame rate of, for example, at least 1000 fps to fast read out two-dimensional digital image data.

For acquiring the two-dimensional digital image data accurately, it is ideal that a pixel of the two-dimensional image data acquisition element such as a CMOS sensor corresponds to a unit data area forming two-dimensional digital image information in one-to-one correspondence.

However, the cost for adjustment is required for position adjustment in the optical system in micron order. In addition, every time an optical disk having encoded two-dimensional digital image information is placed on a drive, its position changes. Therefore, it can be said that strict position adjustment in the optical system is extremely difficult.

In addition, a lens system included in the optical system is required to be small in size and low in cost. Therefore, it cannot be avoided that optical aberration occurs in two-dimensional digital data. It is difficult to implement to associate a unit data area with a pixel strictly in one-to-one correspondence.

As its countermeasure, a technique called "oversampling" is used. In the "oversampling" technique, the pixel pitch of the two-dimensional image data acquisition elements is downsized to 1/N as compared with the pitch of the unit data areas which form the two-dimensional digital image and information of a unit data area is acquired by using $N^2$ pixels. (See, for example, Mark Ayres, Alan Hoskins, and Kevin Curtis, "Image oversampling for page-oriented optical data storage," Applied Optics, Vol. 45, Issue 11, pp. 2459-2464.)

Even when this oversampling technique is used, the pixel output assumes a middle value between "1" (high level) and "0" (low level) in pixels other than pixels for which the above-described accurate digital data are acquired. Although the data quantity of the unit data area in the two-dimensional image data acquisition element is one bit, an output of M ($\geq 2$) bits is required to acquire and output pixel output data of the middle level.

In addition, the light intensity in the unit data area varies under the influence of an output power variation of short-wavelength laser light applied to an optical disk as a reference beam in order to obtain a holographic image and an optical loss in an optical system including the optical disk. Even in outputs of pixels for which digital data can be acquired accurately, the value of "1" (high level) varies. To solve this variation issue, the output of M ($\geq 2$) bits is required although the data quantity of the unit data area in the two-dimensional image data acquisition element is only one bit.

For reconciling the M-bit output and the above-described fast readout, it is necessary to use a special CMOS image sensor as the two-dimensional image data acquisition element.

For example, it becomes necessary to use a multi-line column CDS (Correlated Double Sampling)/ADC mounting CMOS sensor increased in speed by using an intra-pixel ADC (Analog-Digital Converter) mounting CMOS sensor in which fast operation is made possible by conducting A/D conversion parallel in all pixels or activating column CDS/ADC's which operate by taking a row as the unit, in parallel in a plurality of rows.

In addition, it is necessary to make outputs of an M-bit ADC faster by using a multi-line digital data parallel output structure which outputs, in parallel, outputs of the M-bit ADC corresponding to K-pixels. The number of output pins becomes M×K. For example, in a 10-pixel parallel readout device having an ADC resolution of 10-bits, M×K=10×10=100 pins are needed.

Therefore, the CMOS sensor chip is difficult to reduce the size and price because of its specialty. Furthermore, the CMOS sensor package needs to have a large number of pins because of its multi-line output structure, and reduction in size and price is difficult in the same way. A multi-line input I/O is needed by an external circuit which receives the output of the CMOS sensor, conducts image signal processing, and reconstructs two-dimensional digital data obtained. In addition, it is necessary for the external circuit to process two-dimensional M-bit information fast. Specifications required of the external circuit are strict, and it is difficult to reduce the size and price of the external circuit in the same way.

SUMMARY OF THE INVENTION

The present invention has been made in view of these circumstances, and an object thereof is to provide a two-dimensional digital data acquisition element and a holographic storage apparatus which can be reduced in size and price and which is ultra-high in speed.

According to a first aspect of the present invention, there is provided a two-dimensional digital data acquisition element which applies light to an optical information recording medium having a plurality of unit data areas each formed of one encoded data and having two-dimensional digital image information recorded thereon, and acquires two-dimensional digital data reproducing the two-dimensional digital image information based on reproduced light supplied from the optical information recording medium, the two-dimensional digital data acquisition element comprising: a pixel area having a plurality of pixels arranged in a matrix form, each of the pixels having a photoelectric conversion element to convert the reproduced light from the optical information recording medium to an electric signal; selection circuits which select the pixel; a readout circuit which reads out an electric signal of a pixel selected by the selection circuits; and a 1-bit AD converter which converts an analog output of the readout circuit to 1-bit digital data, wherein a pitch ratio N between a pitch P1 of the unit data areas in the two-dimensional digital image information and a pitch P2 of the pixels in the pixel area defined as N=P1/P2 satisfies a relation $$A \cdot n^2/(An+1) < N < A \cdot n^2/(An-1)$$

where A is the number of digital data in one-dimensional direction of one byte of the two-dimensional digital data and n is a natural number of at least 2.

A according to a second aspect of the present invention, there is a provided a holographic storage apparatus comprising the two-dimensional digital data acquisition element according to a first aspect as a pickup element.

BRIEF DESCRIPTION OF THE DRAWINGS

FIG. 8 is a schematic diagram showing 1-bit digital outputs obtained by performing 1-bit AD conversion on the outputs shown in FIG. 6;

FIG. 24(a) to FIG. 24(f) are diagrams for explaining an example 1 in which a real number N is substantially a natural number n in oversampling; and FIG. 25(a) to FIG. 25(f) are diagrams for explaining an example 2 in which a real number N is substantially a natural number n in oversampling.

DESCRIPTION OF THE EMBODIMENTS

Figure 1:
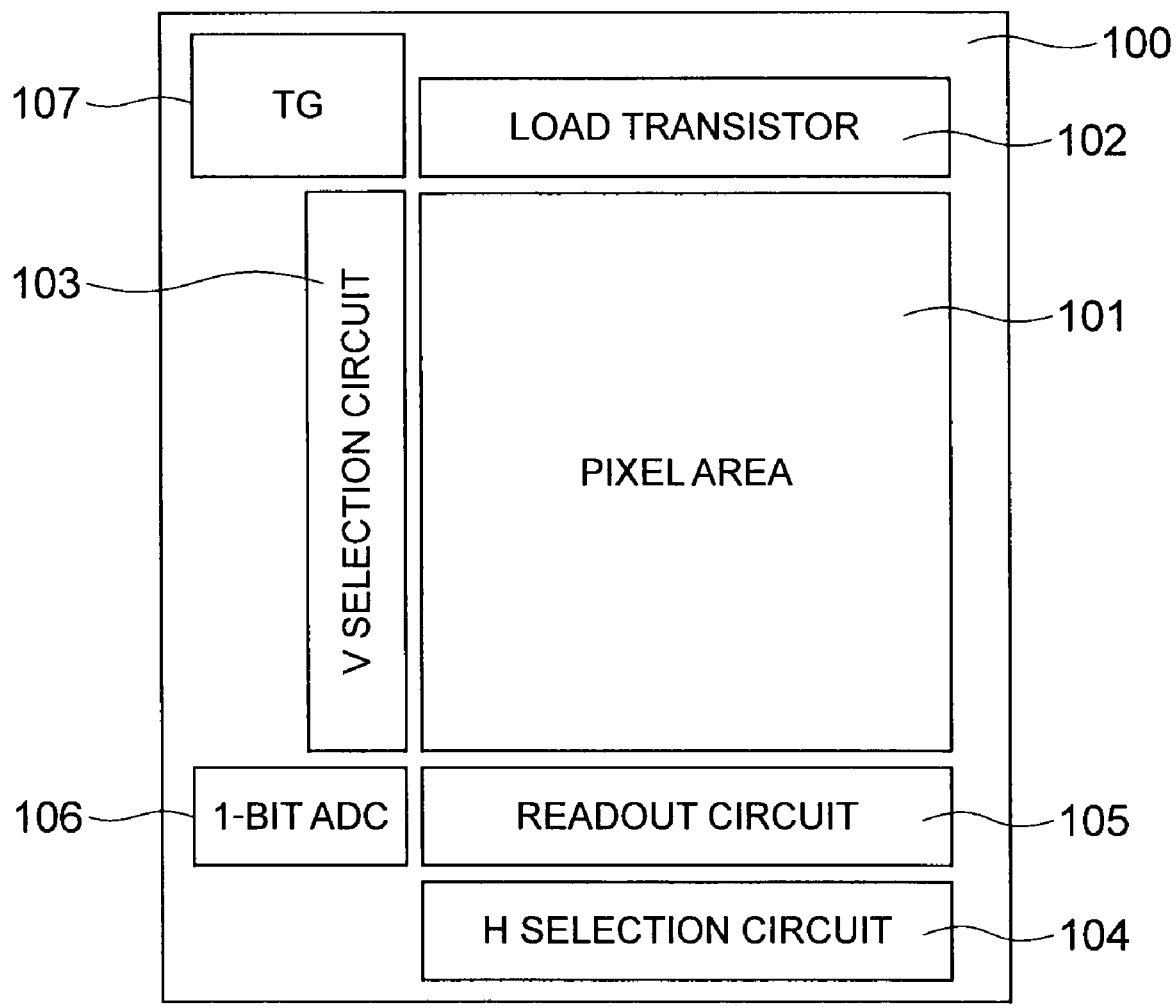
FIG. 1 is a block diagram showing a two-dimensional digital data acquisition element according to a first embodiment.

Prior to description of embodiments of the present invention, "oversampling" will now be described. "Oversampling" means that the pixel pitch of the two-dimensional image data acquisition element is downsized to 1/N as compared with the pitch of unit data areas which form the tow-dimensional digital image and information of each unit data area is acquired by using $N^2$ pixels. For example, if N=2, accurate digital data can be obtained in one pixel among $N^2$=4 pixels. If N=3, accurate digital data can be obtained in four pixels among nine pixels.

Here, N is designed to become a natural number n. Strictly speaking, however, N becomes a value close to the natural number n. The reason is as follows: even if design is conducted so as to make N become the natural number n as an ideal design value, N strictly becomes a value close to the natural number n (N≈n) in an actual element or device due to a cause such as optical aberration described in BACKGROUND OF THE INVENTION.

As concrete examples, two examples, i.e., a first example and a second example will now be described.

First Example

Supposing that n=3, the case where each byte in two-dimensional digital data is formed of 8 bits stored in 1 row by 8 columns is shown in FIGS. 24(a) to 24(f). Even if N=n=3 is set as an ideal design at this time, it follows that N≈n for the above-described reason.

FIGS. 24(a) to 24(f) shows five kinds of position relation between 1-byte section in the two-dimensional digital data and pixels of a two-dimensional digital data acquisition element corresponding thereto.

In an ideal case of N=n=3, 8×3=24 pixels completely correspond to 1-byte digital data of 8 bits shown in FIG. 24(a) (FIG. 24(d)). Under the influence of the optical aberration or the like, however, it follows that N≈n=3. FIGS. 24(b), 24(c), 24(e) and 24(f) show the case where there is mismatch between digital data and pixels such as N=2.88, 2.94, 3.06 and 3.13. At this time, it is possible to conduct adjustment so as to allow less than one pixel as the variation in the number of pixels in each byte section caused by an oversampling quantity deviation in the two-dimensional digital data acquisition element. In the present example, a real number N satisfying the condition 2.88<N<3.13 is allowable.

Second Example

Supposing that n=3, the case where each byte in two-dimensional digital data is formed of 16 bits stored in 4 rows by 4 columns is shown in FIGS. 25(a) to 25(f). Even if N=n=3 is set as an ideal design at this time, it follows that N≈n for the above-described reason.

FIGS. 25(a) to 25(f) show five kinds of position relation between a 1-row by 4-column data section which forms a part of 1 byte=4×4 bits in two-dimensional digital data and pixels of a two-dimensional digital data acquisition element corresponding thereto, in the same way as FIGS. 24(a) to 24(f).

In an ideal case of N=n=3, 4×3=12 pixels completely correspond to 1-row by 4-column data section (FIG. 25(d)). Under the influence of the optical aberration or the like, however, it follows that N≈n=3. FIGS. 25(b), 25(c), 25(e) and 25(f) show the case where there is mismatch between digital data and pixels such as N=2.77, 2.88, 3.06 and 3.23. At this time, it is possible to conduct adjustment so as to allow less than one pixel as the variation in the number of pixels in the 1-row by 4-column section caused by an oversampling quantity deviation in the two-dimensional digital data acquisition element. In the present example, a real number N satisfying the condition 2.77<N<3.23 is allowable.

For given values of n (natural number) in design and the number A of digital data in one axis direction (one-dimensional direction), N satisfying the following expression is hereafter referred in the present specifications to as "substantially a natural number n":

$$A \cdot n^2/(A \cdot n+1) < N < A \cdot n^2/(A \cdot n-1)$$

where n is a natural number of at least 2.

Embodiments of the present invention will now be described. It is supposed in the embodiments that N in the oversampling is "substantially a natural number n."

First Embodiment

Hereafter, embodiments will be described in detail with reference to the drawings. In the ensuing description with reference to the drawings, the same components are denoted by like reference characters and duplicated description will be omitted. The drawings are schematic, and relations between thickness and plane dimensions and ratios in thickness among layers are different from actual ones.

In addition, between drawings as well, portions in which dimension relations or ratios are different from each other are included.

FIG. 1 shows a schematic configuration of a two-dimensional digital data acquisition element according to a first embodiment.

A two-dimensional digital data acquisition element 100 according to the present embodiment includes a pixel area 101, a load transistor part 102, a V selection circuit (vertical selection circuit) 103, an H selection circuit (horizontal selection circuit) 104, a readout circuit 105, a 1-bit A/D converter (hereafter referred to as 1-bit ADC as well) 106, and a timing generator 107 (hereafter referred to as TG circuit as well).

The readout circuit 105 includes a 1H memory circuit which retains an analog signal corresponding to one row. The load transistor part 102, the V selection circuit 103, the H selection circuit 104, the readout circuit 105, the 1-bit ADC 106, and the TG (timing generator) circuit 107 are disposed around the pixel area 101. It is also possible to dispose a CDS (Correlated Double Sampling) circuit between the pixel area 101 and the readout circuit 105 in order to remove noise peculiar to pixels. However, the CDS circuit may not be disposed as shown in FIG. 1. The TG circuit 107 may be disposed on a different chip or may be mounted on a signal processing circuit which is not shown in FIG. 1.

In the pixel area 101, pixels each having a photoelectric conversion element which converts an incident light signal to an electric signal by photoelectric conversion are arranged in a two-dimensional matrix form. Signals generated in the pixels arranged in the matrix form are output in a time series form by the V selection circuit 103 and the H selection circuit 104 as hereafter described.

Signals obtained by photoelectric conversion conducted in pixels disposed on a row selected by the V selection circuit 103 are read out to the readout circuit 105 via a signal line 207 (see FIG. 2) and retained.

Signals retained in a 1H memory circuit included in the readout circuit 105 are selected successively by the H selection circuit 104 and are outputted in a time series form. The output signals in the time series form are outputted to the outside via the 1-bit ADC 106 as a 1-bit digital signal. The V selection circuit 103, the H selection circuit 104, the readout circuit 105 and the 1-bit ADC 106 are operated by timing control pulses outputted from the TG circuit 107, respectively.

Figure 2:
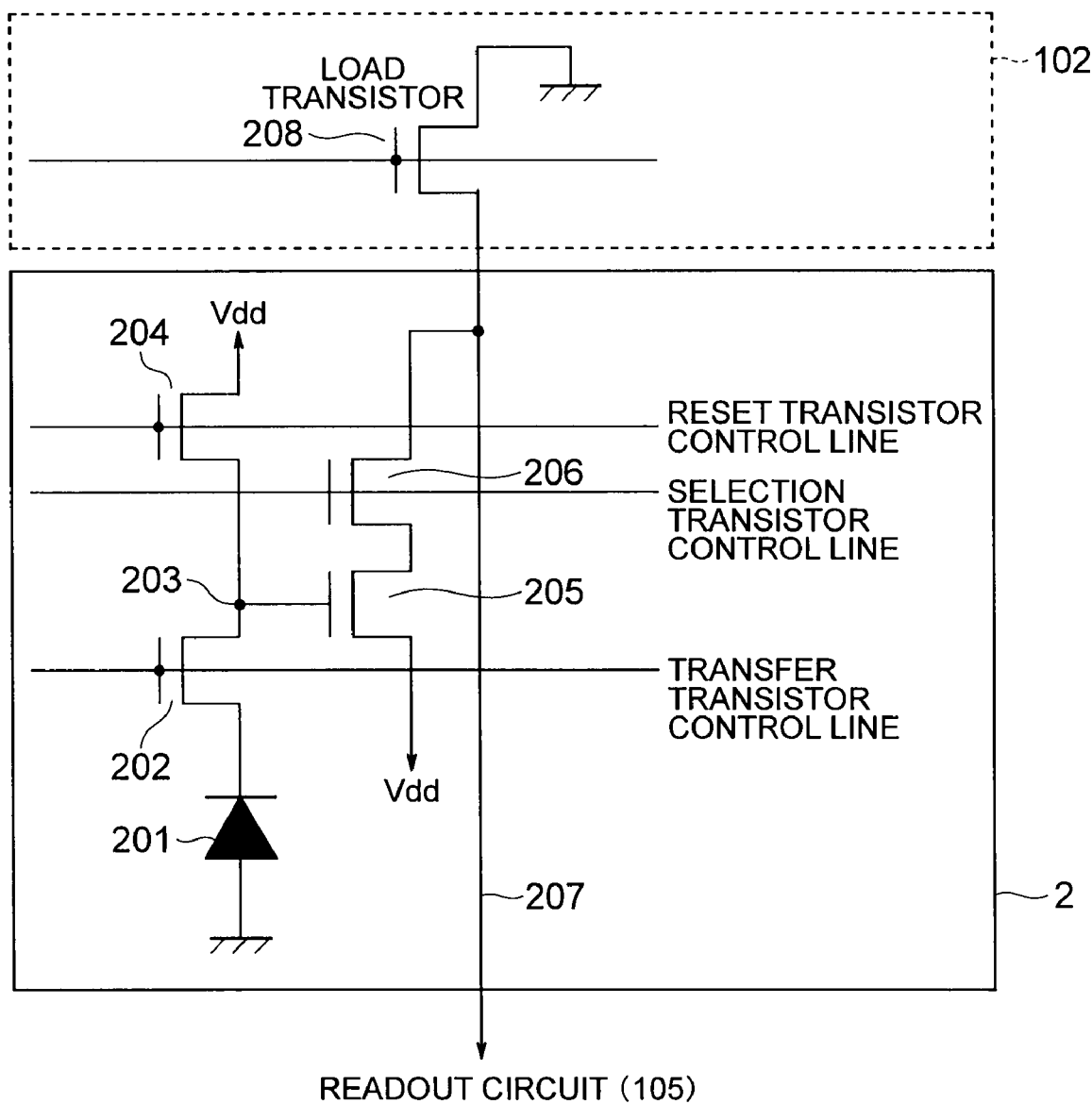
FIG. 2 is a circuit diagram showing a pixel of the two-dimensional digital data acquisition element according to the first embodiment.

FIG. 2 shows a circuit diagram of a pixel 2 included in the pixel area 101 according to the present embodiment and the load transistor part 102. The pixel 2 has a 4-transistor structure including the so-called n-channel MOS transistors. The pixel 2 includes a photodiode 201 which is a photoelectric conversion element, a transfer transistor 202 which transfers signal charges stored in the photodiode 201 to a detection node 203, a reset transistor 204 which resets potential at the detection node 203, an amplification transistor 205 connected at its gate to readout potential at the detection node 203, and a selection transistor 205 for selecting a pixel which outputs a signal obtained by photoelectric conversion. A transfer transistor control line, a reset transistor control line, and a selection transistor control line respectively connected to gates of the transfer transistor 202, the reset transistor 204 and the selection transistor 206 are controlled at predetermined timing by the V selection circuit 103.

The signal line 207 disposed in a vertical direction of the pixel area 101 is connected to the selection transistor 206 in the pixel at its source. A load transistor 208 in the load transistor part 102 and the amplification transistor 205 in the pixel 2 constitute a source follower circuit. Only a pixel for which the selection transistor 206 has been brought into the on-state among a plurality of pixels connected to the same signal line 207, i.e., only a pixel selected by the V selection circuit 103 constitutes the above-described source follower circuit. A potential depending upon the potential at the detection node in the selected pixel is generated on the signal line 207 of each column and read out by the readout circuit 105 and retained.

Figure 3:
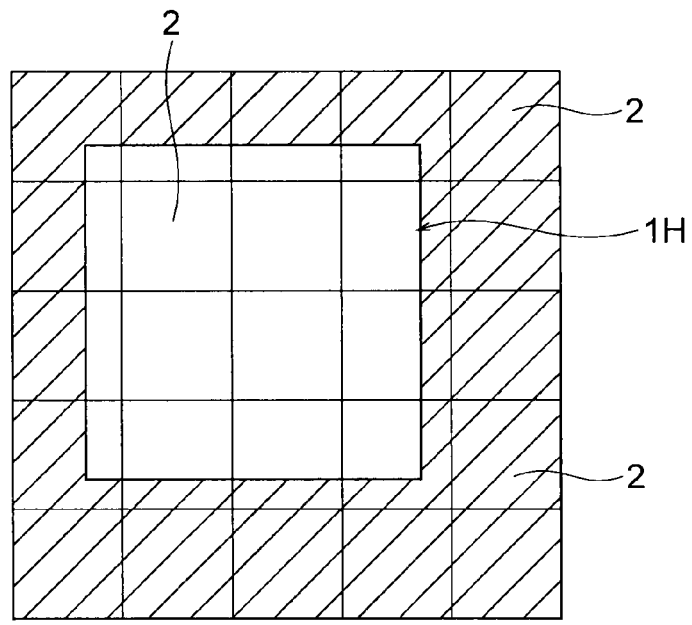
FIG. 3 is a schematic diagram for explaining relative position relations between a high-level data block and pixels in two-dimensional digital data.

FIG. 3 is a schematic diagram for explaining relative position relations between a high-data unit data area 1H surrounded by a low-data unit data area in the two-dimensional digital data image and a part of the pixel area 101. FIG. 3 shows a case where N=3 in the oversampling. In FIG. 3, the high-data unit data area 1H having a pixel size of 3 rows by 3 columns is illuminated in a part where 25 pixels in 5 rows by 5 columns are arranged as the pixels 2. Edges of the high-data unit data area 1H do not coincide with boundaries of the pixels 2. This figure represents a typical state in which the position adjustment of the ultra-fast two-dimensional digital data acquisition element 100 is not conducted.

Figure 4:
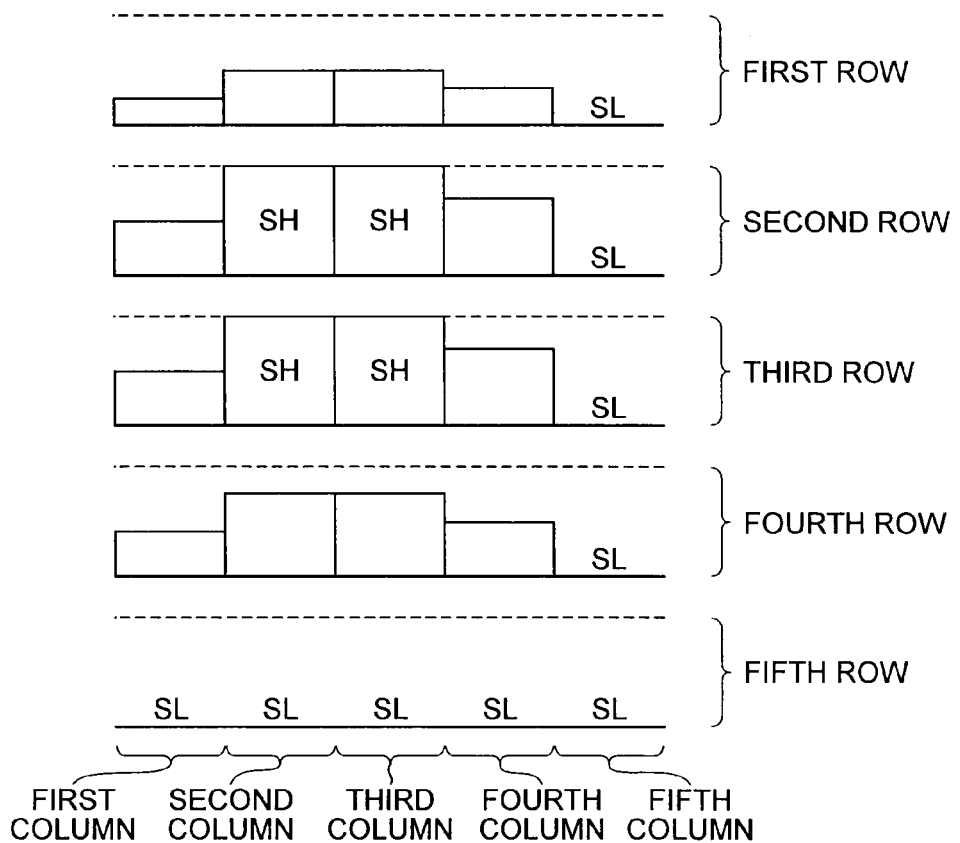
FIG. 4 is a schematic diagram showing outputs obtained when two-dimensional digital data shown in FIG. 3 is read out.

FIG. 4 shows pixel outputs obtained from 25 pixels arranged in 5 rows by 5 columns shown in FIG. 3.

A pixel 2 in the nth row and the mth column is represented as (n, m). As for each of four pixels (2, 2), (2, 3), (3, 2) and (3, 3), the whole pixel is included in the high-data unit data area 1H as appreciated from FIG. 3. Their outputs become high-data: SH. On the other hand, as for each of twelve pixels in contact with the above-described four pixels, a part of the pixel is included in the high-data unit data area 1H and its output S becomes an intermediate level, lower than the high-data. As for each of nine pixels which are not included in the high-data unit data area 1H, its output S becomes low-data: SL.

Figure 5:
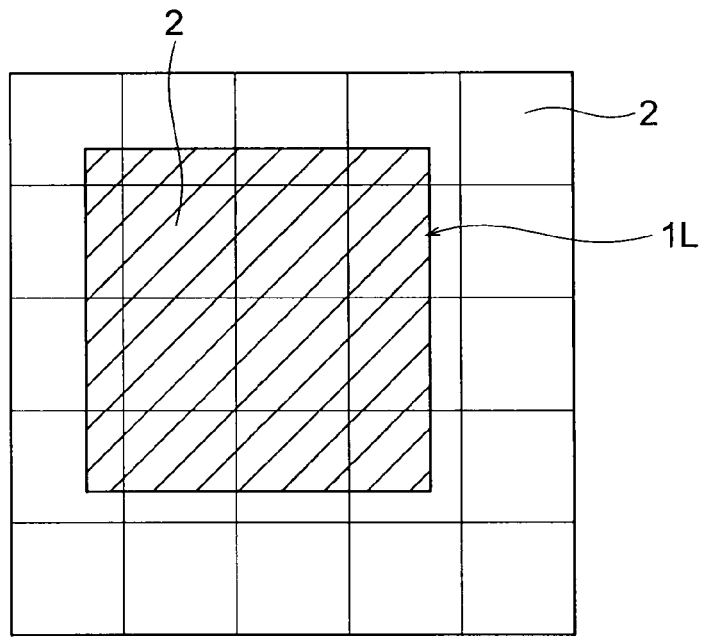
FIG. 5 is a schematic diagram for explaining relative position relations between a low-level data block and pixels in two-dimensional digital data.
Figure 6:
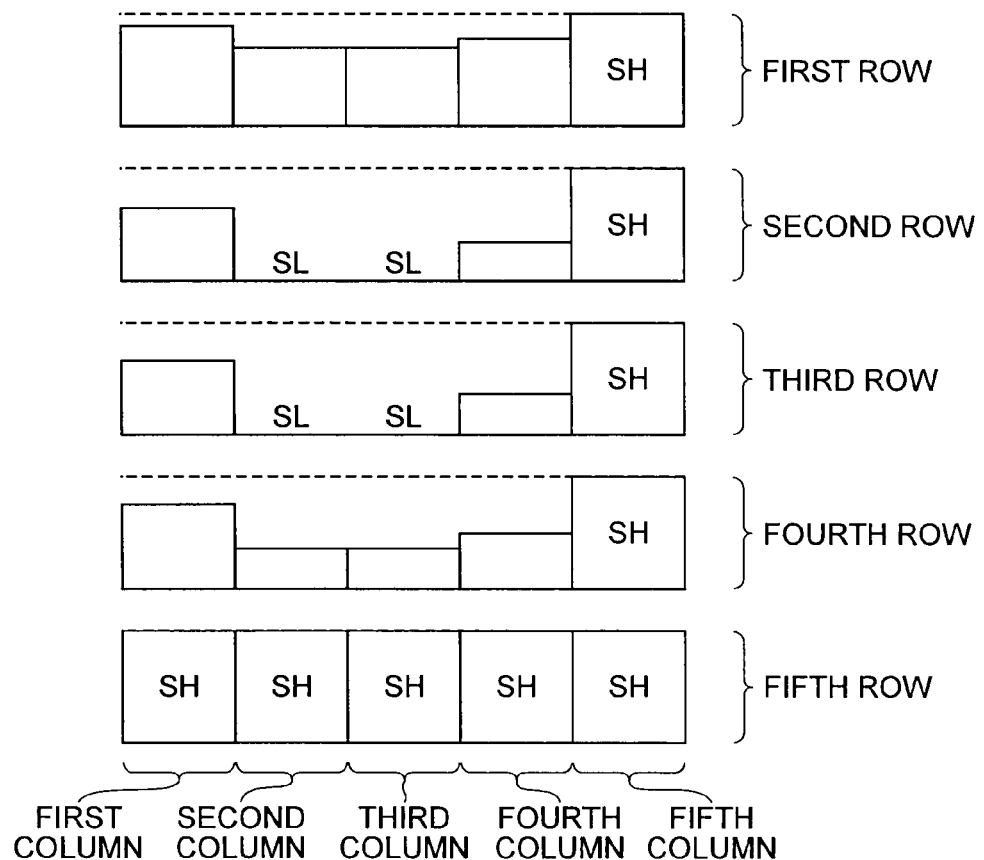
FIG. 6 is a schematic diagram showing outputs obtained when two-dimensional digital data shown in FIG. 5 is read out.

FIG. 5 is a schematic diagram for explaining relative position relations between a low-data unit data area 1L surrounded by a high-data unit data area in the two-dimensional digital data image and a part of the pixel area 101. FIG. 6 shows pixel outputs obtained at this time.

A pixel 2 in the nth row and the mth column is represented as (n, m). As for each of four pixels (2, 2), (2, 3), (3, 2) and (3, 3), the whole pixel is included in the low-data unit data area 1L as appreciated from FIG. 5. Their outputs become low-data: SL. On the other hand, as for each of twelve pixels in contact with the above-described four pixels, a part of the pixel is included in the low-data unit data area 1L and its output S becomes an intermediate level higher than the low-data. As for each of nine pixels which are not included in the low-data unit data area 1L, its output S becomes high-data: SH.

When an ordinary CMOS sensor is used, analog outputs shown in FIG. 4 or FIG. 6 are output intact, or the analog outputs are subjected to analog-digital conversion by an N-bit ADC and output as N-bit digital data.

Figure 7:
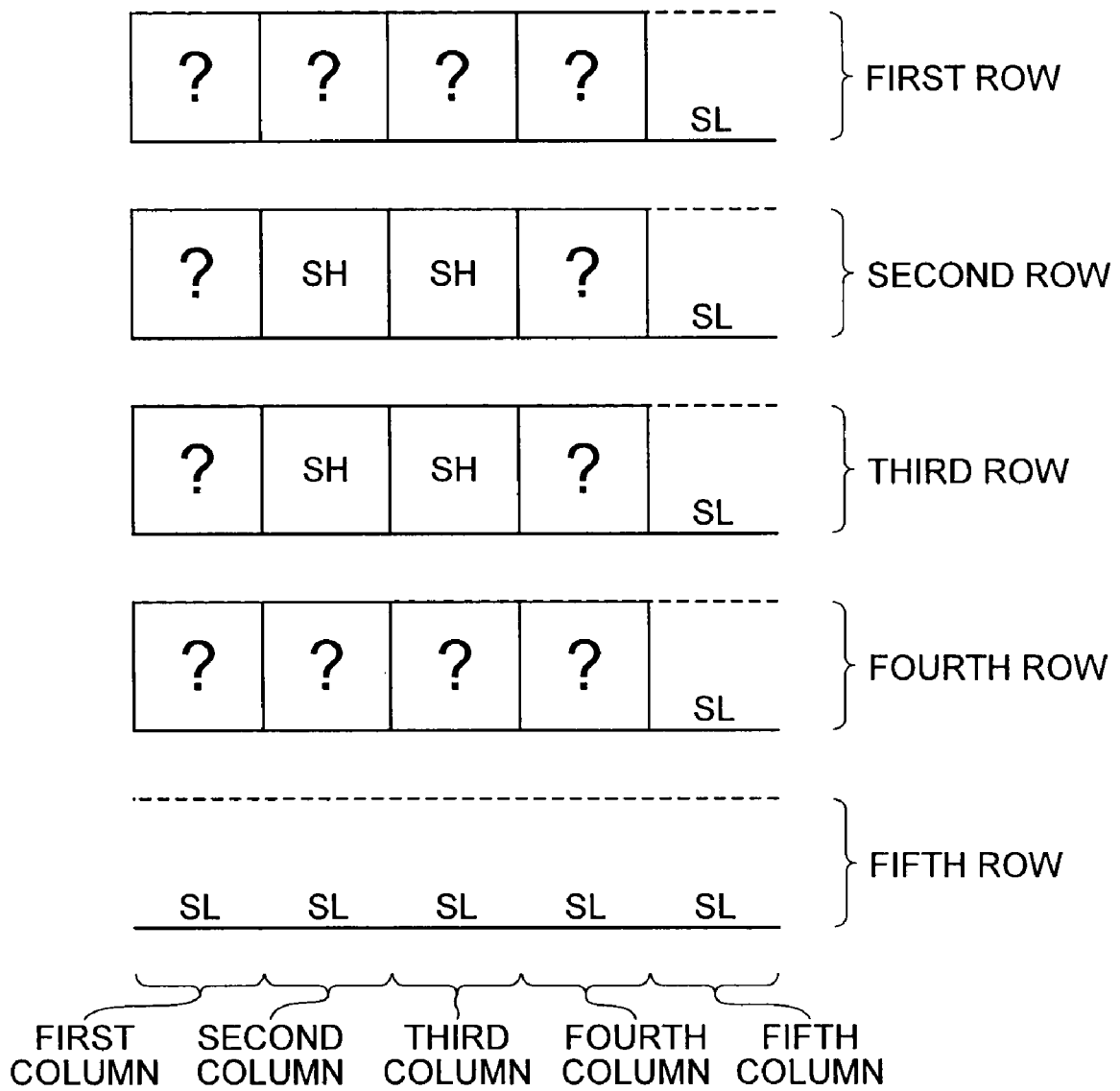
FIG. 7 is a schematic diagram showing 1-bit digital outputs obtained by performing 1-bit AD conversion on the outputs shown in FIG. 4.

In the present embodiment, however, the analog outputs shown in FIG. 4 or FIG. 6 are converted to 1-bit digital outputs and are outputted by the 1-bit ADC 106 shown in FIG. 1. A threshold voltage Vth of the 1-bit ADC 106 is set so as to satisfy the relation SL<Vth<SH, and SL and SH are converted to 0 and 1, respectively. As for an intermediate level output SM satisfying the relation SL<SM<SH, it is not determined whether the obtained output is 0 or 1 depending upon the relation between Vth and SM. The indefinite output is denoted by "?." FIG. 7 and FIG. 8 show results obtained by converting the outputs shown in FIG. 4 and FIG. 6 by means of the 1-bit ADC 106, respectively. If two consecutive 1-bit digital output values assume the same value regardless of whether the indefinite output is 1 or 0, then it is possible to recognize whether the unit data area is high or low on the basis of the same value as appreciated from FIG. 7 and FIG. 8.

The case where unit data areas indicating the same information are adjacent to each other is not described with reference to FIGS. 3 to 8. In that case, however, there is no intermediate gradation output generated in a boundary part between a high-data area and a low-data area. Therefore, at least 2+3=5 consecutive same digital data are output. Even if the same data are adjacent to each other, therefore, it is possible to recognize high/low by counting pixels from which the same digital data is output consecutively by using a counter provided in an external circuit. For example, the number of pixels from which the same data is output consecutively is denoted by n. If $n \leq 1$, the output is caused by noise and should be disregarded. If $2 \leq n \leq 4$, it can be recognized that there is one data area corresponding to SH or SL. If $5 \leq n \leq 7$, it can be recognized that there are two consecutive data areas corresponding to SH or SL. If $(3m-1) \leq n \leq (3m+1)$, it can be recognized that there are m consecutive data areas corresponding to SH or SL.

In the external circuit, it is possible to make a decision whether data changes between upper and lower 1-bit digital data adjacent to each other by utilizing a 1-bit memory corresponding to one row and recognize the unit data area by using a similar method. Although the counter is provided in the external circuit in the present embodiment, the counter may be a counter 120 incorporated in the two-dimensional digital data acquisition element 100 as in a second embodiment described later.

Figure 9A:
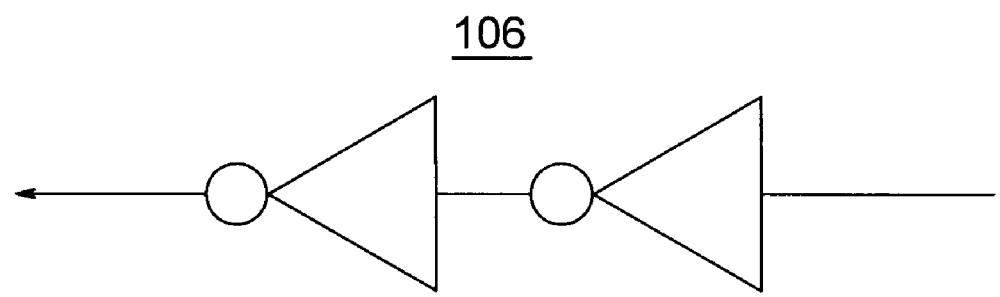
FIGS. 9A and 9B are circuit diagrams showing a 1-bit ADC in the two-dimensional digital data acquisition element according to the first embodiment.
Figure 9B:
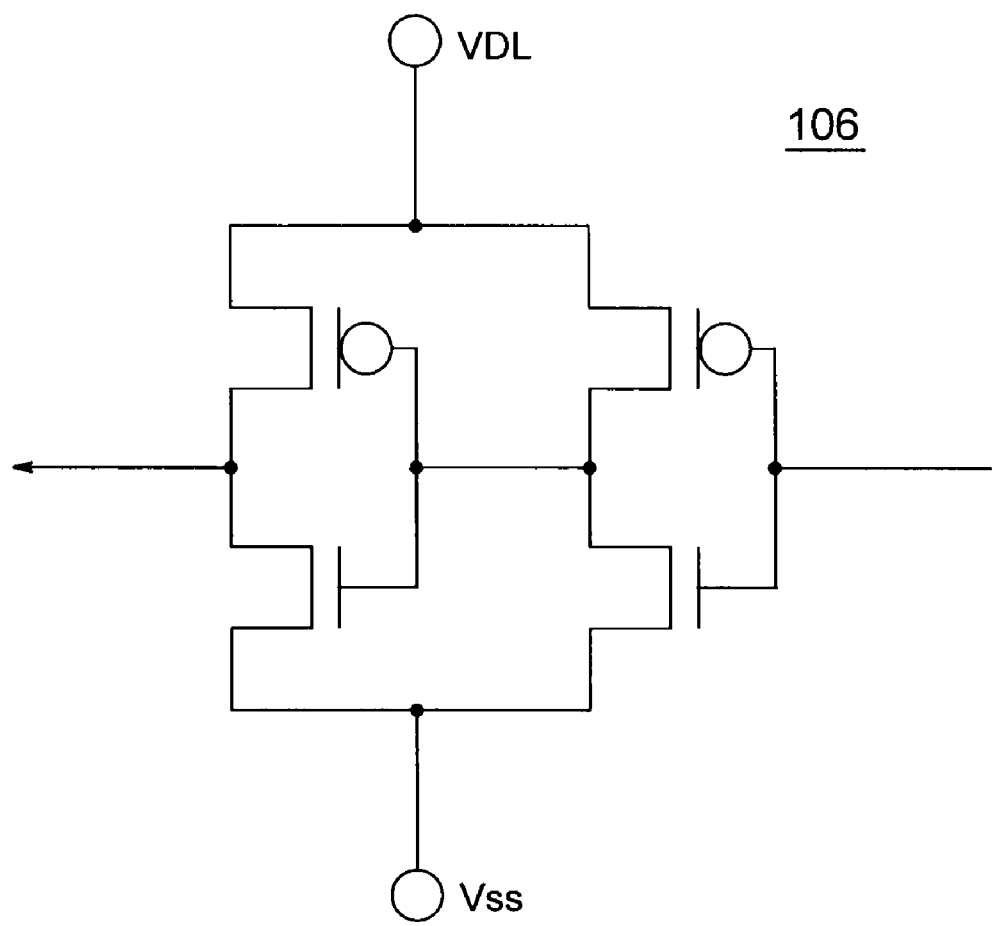

As the 1-bit ADC 106, two-stage inverter circuits connected in series as shown in FIG. 9A, i.e., two-stage CMOS inverter circuits connected in series as shown in FIG. 9B can be used. In FIG. 9B, CMOS inverter circuits of two stages are connected in series. Unless the output polarity or operation margin is taken into consideration, however, an inverter circuit of a single stage may be used, or a serially connected configuration of at least three stages may be used.

A power supply voltage VDL of the 1-bit ADC shown in FIGS. 9A and 9B can be controlled independently so as to supply a voltage different from another power supply voltage Vdd and it is more desirable to do so. The reason is that the threshold voltage Vth of the 1-bit ADC can be controlled by voltage VDL. Its details will be described with reference to other embodiments.

Figure 10:
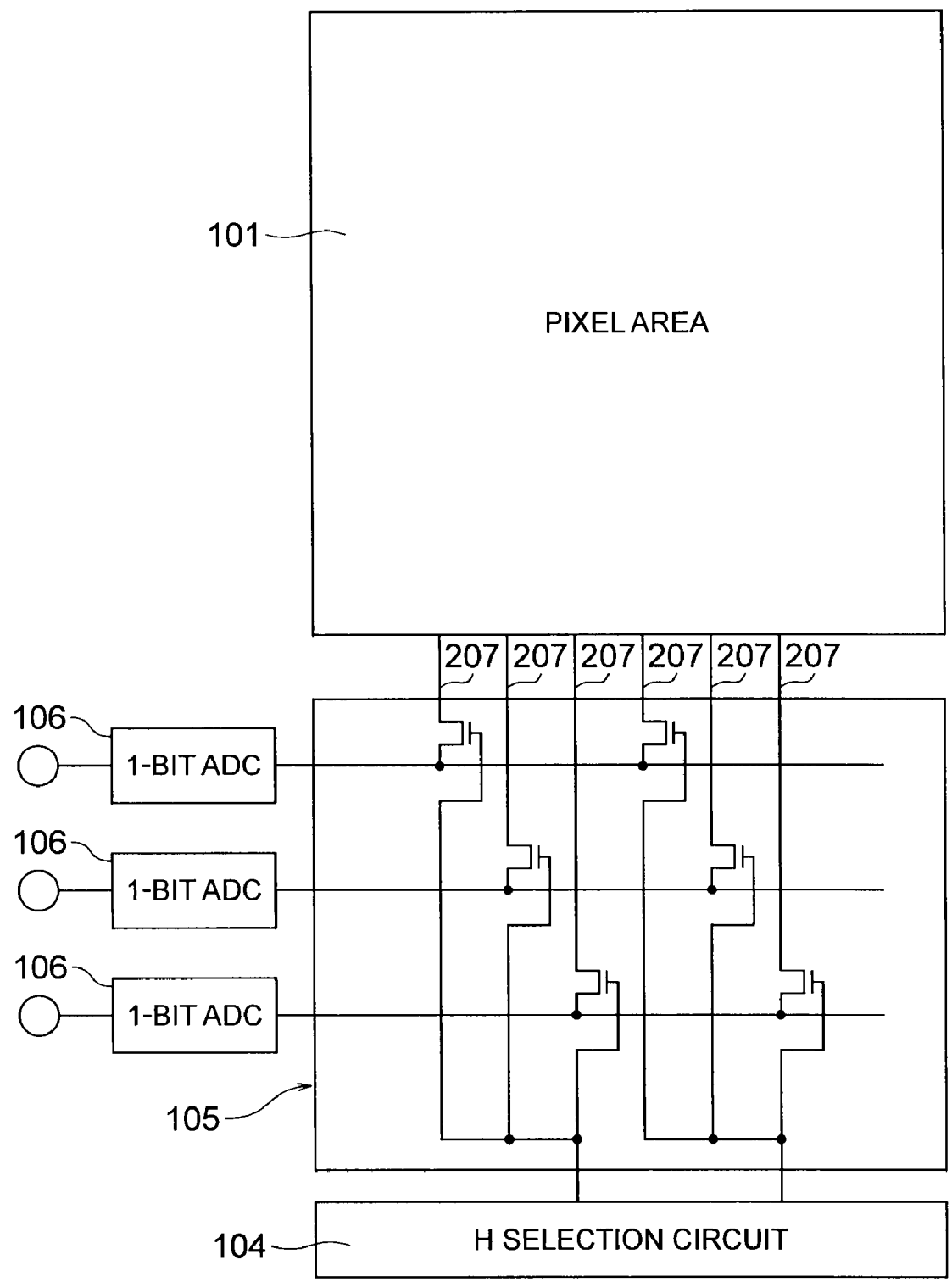
FIG. 10 is a block diagram for explaining a multi-line readout structure in the two-dimensional digital data acquisition element according to the first embodiment.

For ultra-fast readout, the readout circuit 105 is typically provided with a multi-line output. For example, by using a 10-line output, the output data rate can be increased to ten times while keeping the clock frequency the same. An example in which the readout circuit 105 receives 3-line outputs is shown in FIG. 10. For brevity, 3-line outputs and signal lines of six columns are shown. As a matter of fact, however, at least 10-line outputs and several hundred or at least one thousand signal lines are included. In FIG. 10, an H selection pulse from the H selection circuit 104 is applied to selection transistors in three columns simultaneously and pixel output information generated on each of the selected signal lines in three columns is conveyed to an output line connected to the selection transistor. Independent 1-bit ADCs 106 are respectively connected to the three output lines. Pixel outputs are converted to 1-bit digital outputs, and output from three output terminals.

At this time, it is important that characteristics of three 1-bit ADCs 106, i.e., the threshold voltages of three 1-bit ADCs 106 are uniform. When the CMOS inverter circuits shown in FIGS. 9A and 9B are used, it is important that threshold voltages Vthp and Vthn respectively of a PMOS transistor and an NMOS transistor are constant. It is known that a main cause of variation of the threshold voltage Vth in transistors in the same substrate is statistical fluctuation in the number of impurities in the channel region. Transistors of the 1-bit ADC 106 are transistors in the peripheral circuit unlike fine transistors in pixels. Therefore, Vthp and Vthn can be kept constant by ensuring the channel area sufficiently. Furthermore, if the substrate is different, the threshold voltage Vth of the CMOS inverter changes according to the mobilities of electrons and holes and the gate oxide film thickness. In the present embodiment, however, it is sufficient that characteristics of transistors on the same substrate are uniform. Therefore, there is no relation if substrates are different.

If it is attempted in the multi-line readout structure to convert pixel outputs to M-bit digital data by using an M-bit ADC and output the M-bit digital data, an extremely large number of output pins are needed. For example, a 10-line readout 10-bit output CMOS sensor is commercialized. In this case, the number of mere output pins amount to 10×10=100, and it is difficult to lower the package cost.

On the other hand, even if a 10-line readout structure is used for fast readout, the number of output pins is barely 10 in the present embodiment because the output data is the 1-bit digital signal. This number of output pins is the same as that of the 1-line readout 10-bit output standard CMOS sensor. Therefore, it becomes possible to use a low-price package, simplify an I/F (interface) to the external circuit, and reduce the size and cost of the whole system.

According to the present embodiment, an ultra-fast two-dimensional digital data acquisition element can be obtained by using a simple device configuration based on a CMOS sensor element having a standard pixel configuration, and a smaller size and a lower cost can be achieved, as heretofore described.

In addition, when multi-line readout is conducted for fast operation, M×K output pins are needed in the conventional M-bit output element, where K is the number of readout lines. On the other hand, in the present embodiment, K output pins are sufficient and not only the chip cost but also the package cost can be remarkably reduced. In addition, since the output is the 1-bit digital output, the two-dimensional digital data reconstruction process in the external circuit is remarkably simplified and the ultra-fast two-dimensional digital data acquisition apparatus can be remarkably reduced in size and cost.

Second Embodiment

Figure 11:
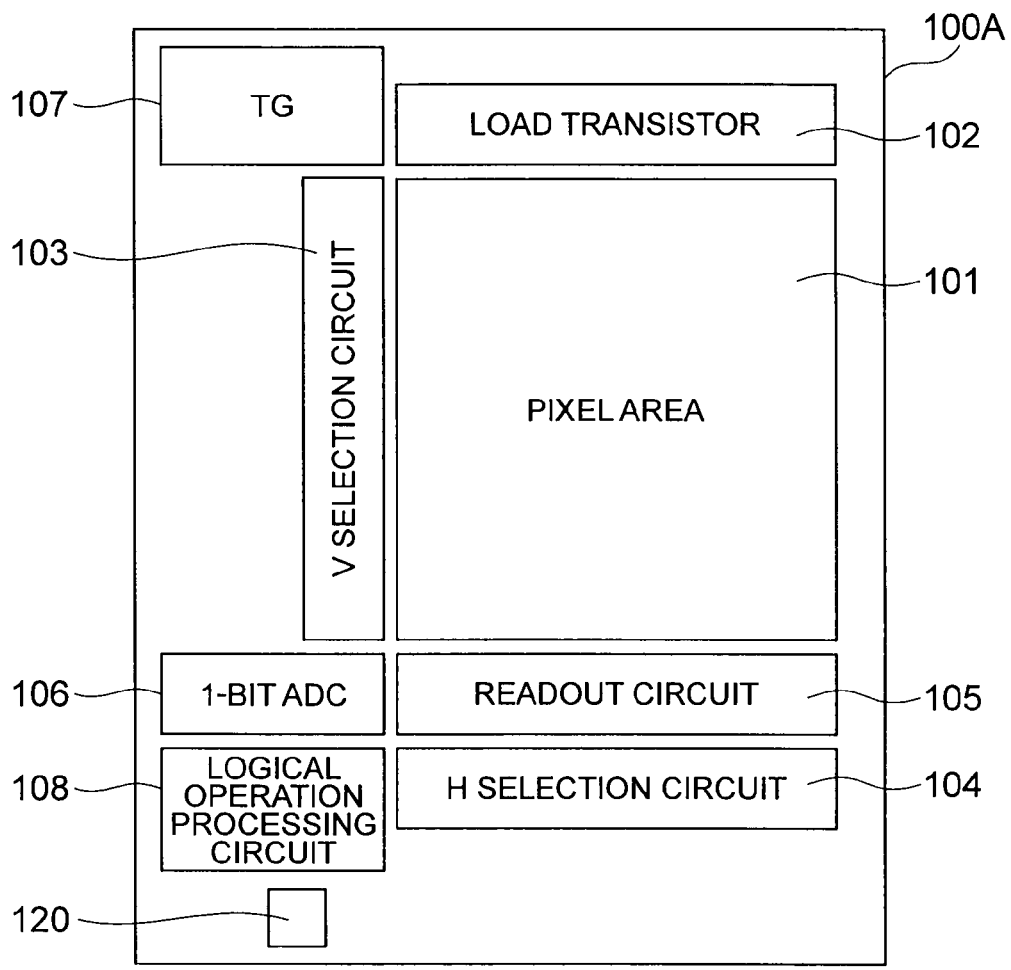
FIG. 11 is a block diagram showing a two-dimensional digital data acquisition element according to a second embodiment.

A schematic configuration of a two-dimensional digital data acquisition element according to a second embodiment of the present invention is shown in FIG. 11. A two-dimensional digital data acquisition element 100A according to the present embodiment has a configuration obtained from the two-dimensional digital data acquisition element 100 according to the first embodiment shown in FIG. 1 by providing a logical operation processing circuit 108 and a counter 120 between the 1-bit ADC 106 and the output terminal.

As described in the first embodiment, two-dimensional digital data can be reconstructed by conducting processing on the 1-bit digital output in the external circuit. In the present embodiment, the processing in the external circuit is simplified by conducting operation processing on the 1-bit digital output in the on-chip logical operation processing circuit 108, outputting a result of the operation as 1-bit digital data, counting the output in the counter 120, and recognizing unit data on the basis of the count value.

Figure 12:
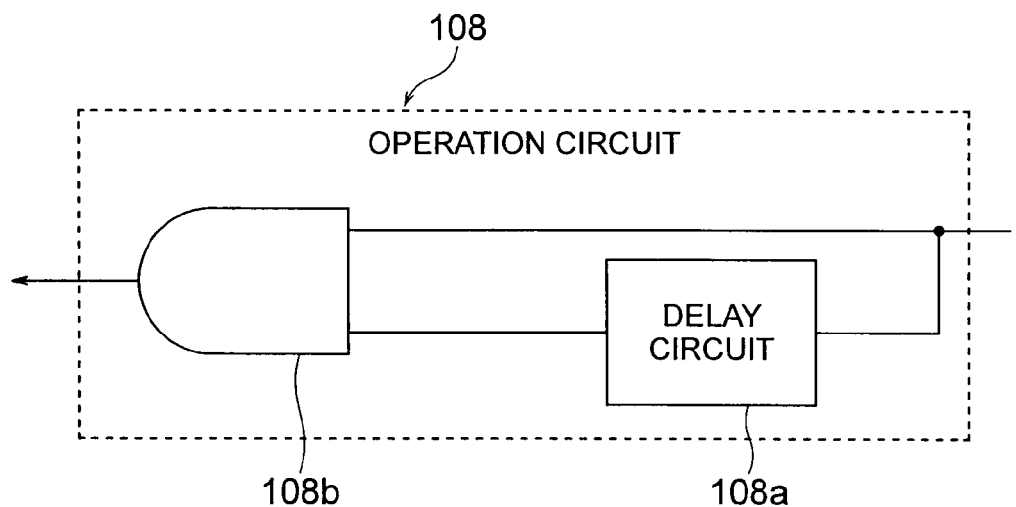
FIG. 12 is a block diagram showing an operation circuit in the two-dimensional digital data acquisition element according to the second embodiment.

A concrete example of the logical operation processing circuit 108 is shown in FIG. 12. An output of the 1-bit ADC 106 is split. One output is input to an AND circuit 108b directly. The other output is input to the AND circuit 108b via a delay circuit 108a. A result of operation conducted by the AND circuit 108b is output. The delay circuit 108a provides a delay corresponding to one pixel. The inter-pixel-data operation processing circuit 108 shown in FIG. 12 performs AND operation between adjacent pixel data read out consecutively. The inter-pixel-data operation processing circuit 108 outputs SH only when the high-data digital output: SH is input over two consecutive pixels.

Figure 13:
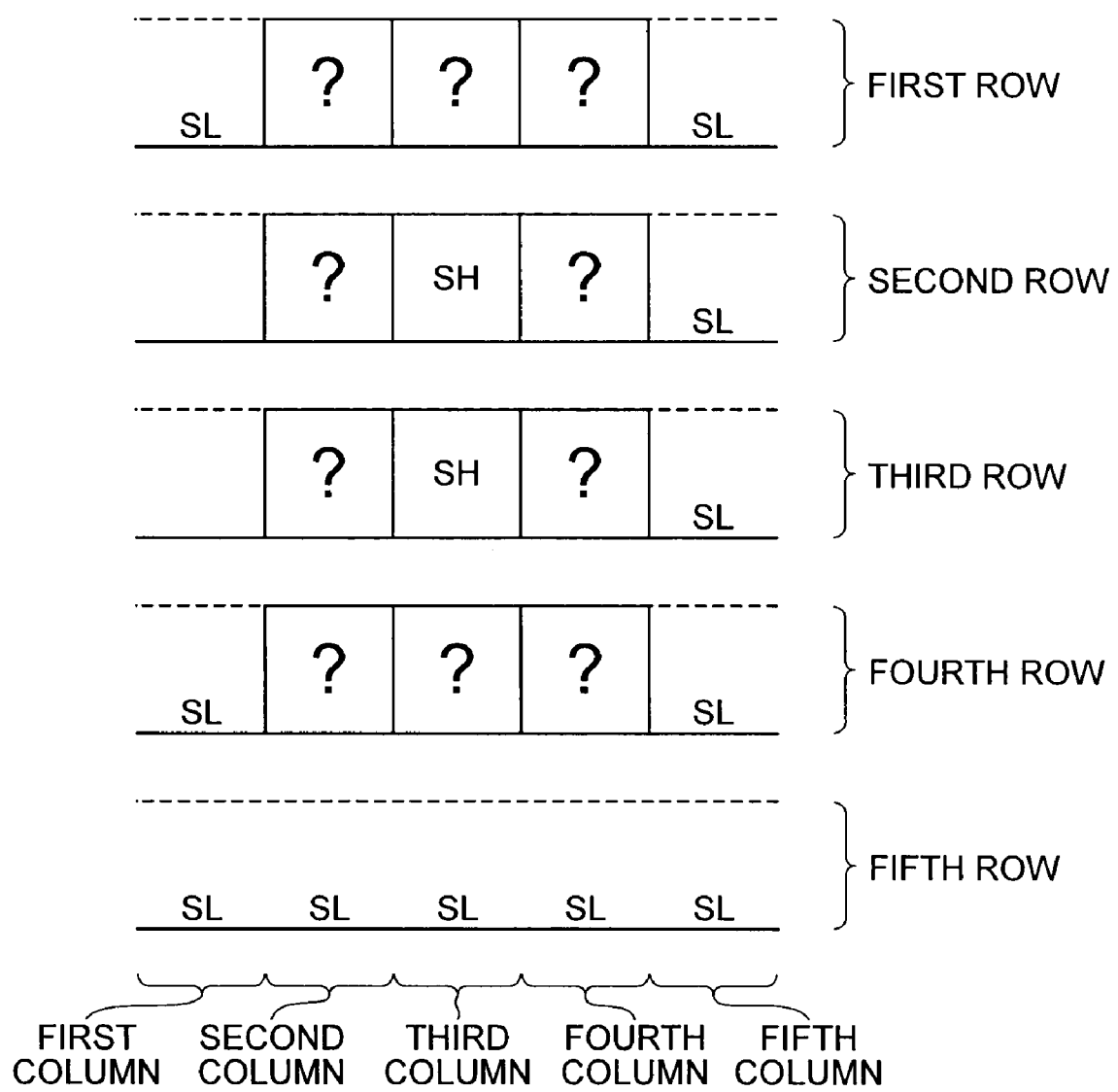
FIG. 13 is a schematic diagram showing outputs obtained by performing operation on the outputs shown in FIG. 7 in the operation circuit shown in FIG. 12.
Figure 14:
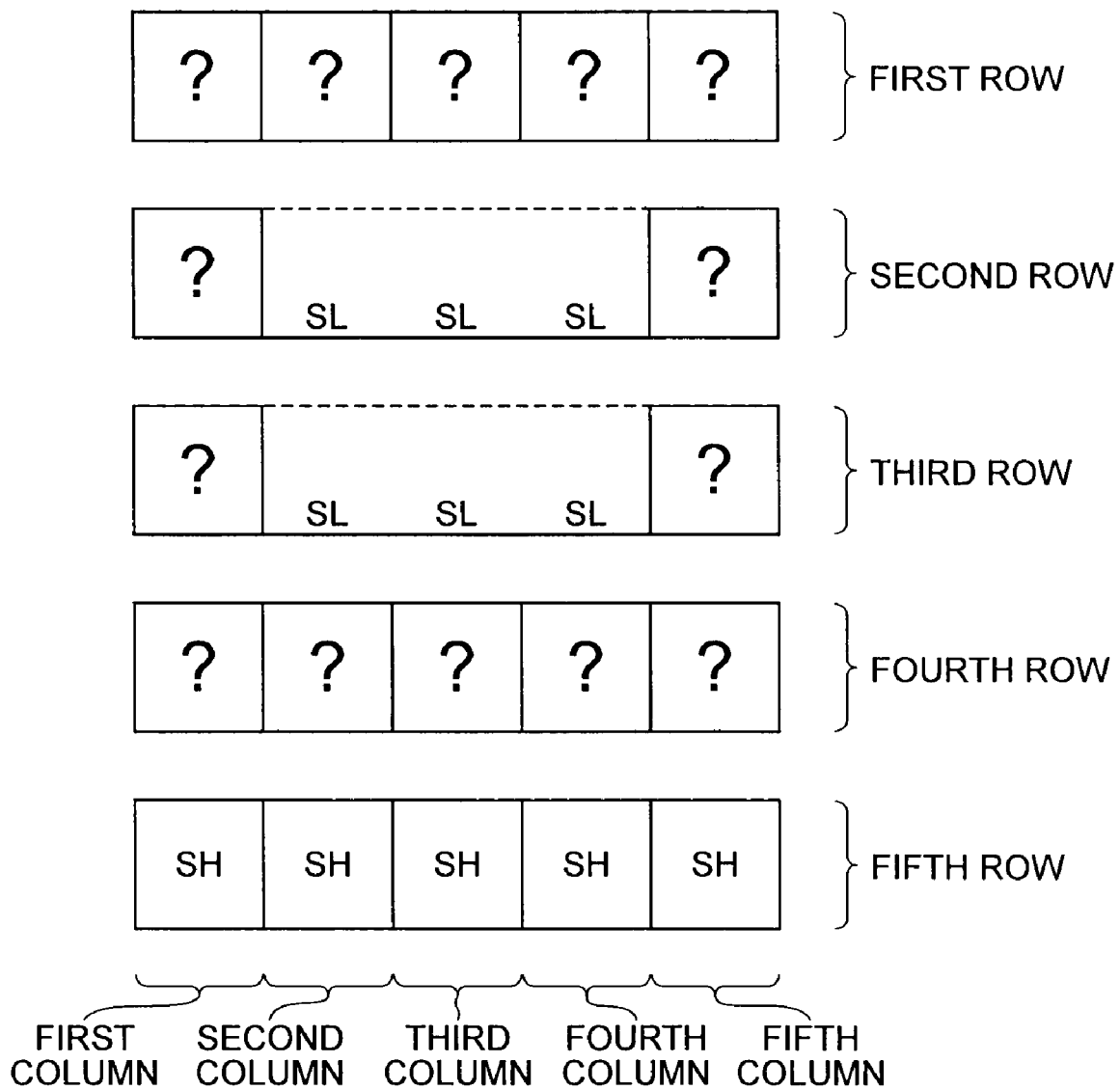
FIG. 14 is a schematic diagram showing outputs obtained by performing operation on the outputs shown in FIG. 8 in the operation circuit shown in FIG. 12.

Two-dimensional digital data shown in FIG. 3 and FIG. 5 are incident. Pixel outputs shown in FIG. 4 and FIG. 6 are obtained. 1-bit digital data shown in FIG. 7 and FIG. 8 is input to the logical operation processing circuit 108 as an output of 1-bit ADC 106. Results of the operation processing obtained at this time are shown in FIG. 13 and FIG. 14. Since there are intermediate gradation outputs, there are indefinite 1-bit digital data "?". If there is a high-data area, however, SH corresponding to at least one pixel is output. On the contrary, if there is a low-data area, SL is output over at least three consecutive pixels. Paying attention to, for example, high-data, therefore, appearance of SH can be recognized as high-data. If two high-data areas are adjacent, SH is output over at least four consecutive pixels. If SH is output, therefore, the number of pixels over which SH is output consecutively may be counted by the counter 120 in the same way as the first embodiment. The number of consecutive high-data areas can be judged on the basis of counts. The number of pixels over which SHs are outputted consecutively is denoted by n. If 1≦n≦3, then one high-data area is recognized. If 4≦n≦6, then two consecutive high-data areas are recognized. If (3m−2)≦n≦3m, then m consecutive high-data areas can be recognized. By the way, even in the external circuit, it is possible to perform AND operation between upper and lower adjacent 1-bit digital data and recognize a high-data area by using a similar method.

Conducting on-chip logical operation processing between pixels as in the present embodiment brings about an important effect besides reducing the load on the processing process in the external circuit. It is an effect that a false output can be prevented on the chip from being caused by a white point image defect.

The white point image defect means that a generation center caused by a crystal defect or heavy metal contamination is formed in the part of the photodiode or the detection node within a pixel and the pixel always outputs high-data irrespective of the incident light quantity. In general, the occurrence ratio of the white point image defect is reduced owing to a well controlled substrate or manufacturing process and it is very rare that white point image defects occur consecutively over adjacent pixels. Therefore, the white point image defect is a point defect on a single pixel. The white point image defect poses a problem in a low-data area, and SH is output in a pixel where originally SL should be output. If logical operation is conducted between pixel data by the operation processing circuit 108 as in the present embodiment, however, a pixel output caused by a white point image defect is removed on the chip.

On the contrary, if a black point image defect which always outputs low-data irrespective of the incident light quantity exists in a high-data area, there is a fear that a high-data area might be lost in the inter-pixel-data operation processing circuit 108 in the present embodiment. However, a black point image defect which causes the output to become low-data is excluded nearly perfectly by a well controlled manufacturing process.

Figure 15:
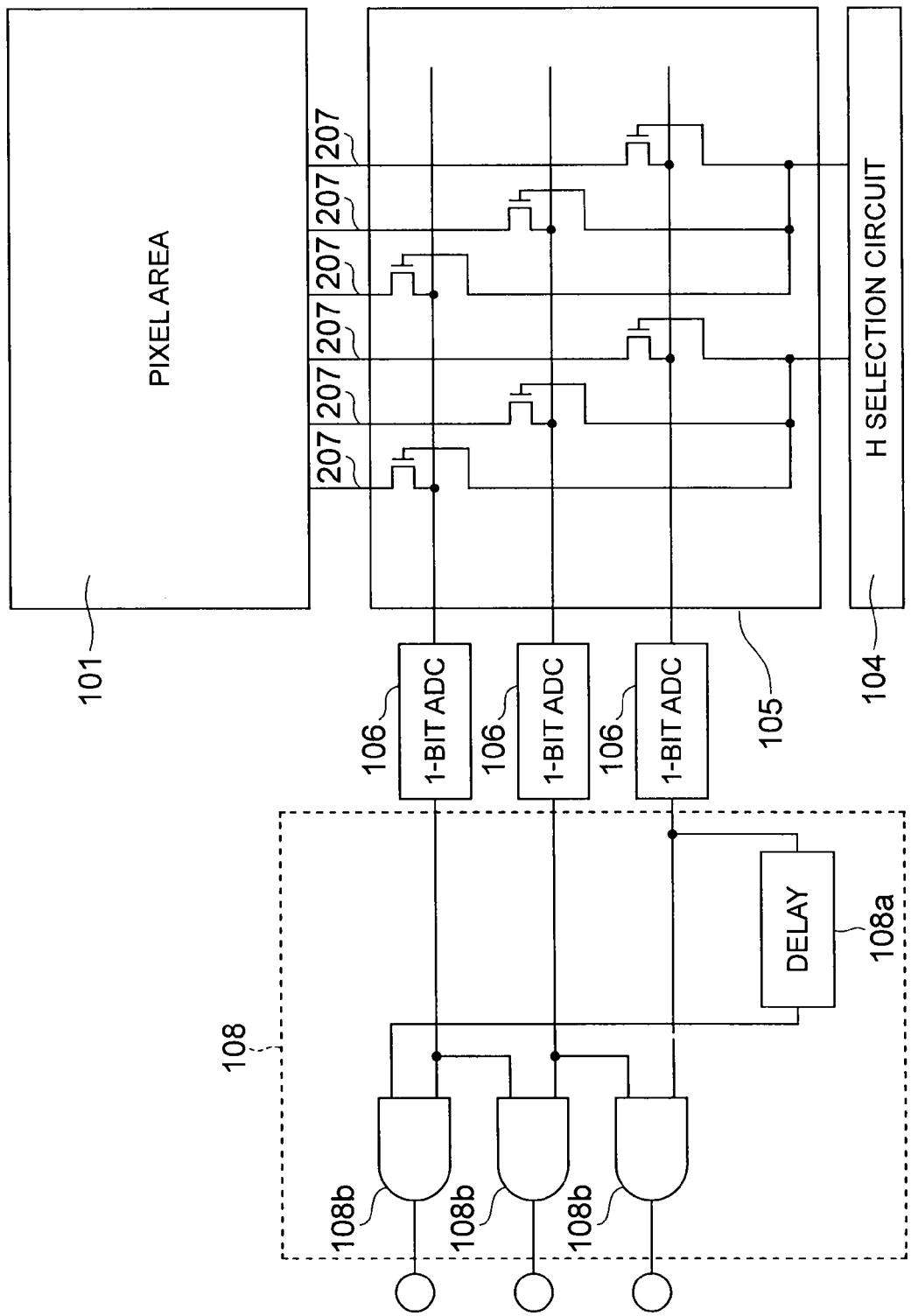
FIG. 15 is a block diagram for explaining a multi-line readout structure in the two-dimensional digital data acquisition element according to the second embodiment.

As described with reference to the first embodiment, the readout circuit 105 is typically provided with a multi-line output for the purpose of ultra-fast readout. For example, the output data rate can be increased to ten times while maintaining the same clock frequency by providing the readout circuit 105 with a 10-line output. A configuration example in the case where the readout circuit 105 is provided with a 3-line output is shown in FIG. 15. For brevity, 3-line outputs and signal lines of six columns are shown. As a matter of fact, however, at least 10-line outputs and several hundred or at least one thousand signal lines are included. In FIG. 15, an H selection pulse from the H selection circuit 104 is applied to selection transistors in three columns simultaneously and pixel output information generated on each of the selected signal lines in three columns is conveyed to an output line connected to the selection transistor. Independent 1-bit ADCs 106 are respectively connected to the three output lines. Pixel outputs are converted to 1-bit digital outputs, and operation processing is conducted on the 1-bit digital outputs. Results of the operation are output from three output terminals.

As described with reference to the first embodiment, it is possible to make characteristics of three 1-bit ADCs 106, i.e., Vth of the 1-bit AD conversion uniform and there is no problem. The inter-pixel-data operation processing circuit 108 shown in FIG. 15 for the multi-line output is different from the inter-pixel-data operation processing circuit 108 shown in FIG. 12.

In the multi-line readout, adjacent columns are selected and output simultaneously. Therefore, digital data output from each readout line via the 1-bit ADC can be input directly to the AND circuit 108b. Only with respect to a column for which an adjacent column is selected and output at different timing, digital data is input to the AND circuit 108b via the delay circuit 108a. Therefore, only one delay circuit 108b is needed irrespective of the number of readout lines.

If it is attempted in such a multi-line readout structure to convert pixel outputs to M-bit digital data by using an M-bit ADC and output the M-bit digital data as in the conventional art, an extremely large number of output pins are needed. For example, a 10-line readout 10-bit output CMOS sensor is commercialized. In this case, the number of mere output pins amount to 10×10=100, and it is difficult to lower the package cost.

On the other hand, even if a 10-line readout structure is used for fast readout, the number of output pins is barely 10 in the present embodiment because the output data is the 1-bit digital signal. This number of output pins is the same as that of the 1-line readout 10-bit output standard CMOS sensor. Therefore, it becomes possible to use a low-price package, simplify the I/F (interface) to the external circuit, and reduce the size and cost of the whole system.

According to the present embodiment, an ultra-fast two-dimensional digital data acquisition element can be obtained by using a simple device configuration based on a CMOS sensor element having a standard pixel configuration, and a smaller size and a lower cost can be achieved, as heretofore described. It is possible to improve the manufacture yield of the element and further reduce the cost by excluding the influence of the white flaw image defect on the chip.

In addition, when multi-line readout is conducted for fast operation, M×K output pins are needed in the conventional M-bit output element, where K is the number of readout lines. On the other hand, in the present embodiment, K output pins are sufficient and not only the chip cost but also the package cost can be remarkably reduced.

In addition, since the output is the 1-bit digital output obtained by operation between pixel data, the two-dimensional digital data reconstruction process in the external circuit is remarkably simplified and the ultra-fast two-dimensional digital data acquisition apparatus can be remarkably reduced in size and cost.

Although in the present embodiment the counter 120 is incorporated in the two-dimensional digital data acquisition element 100A, the counter 120 may be provided outside.

Third Embodiment

Figure 16:
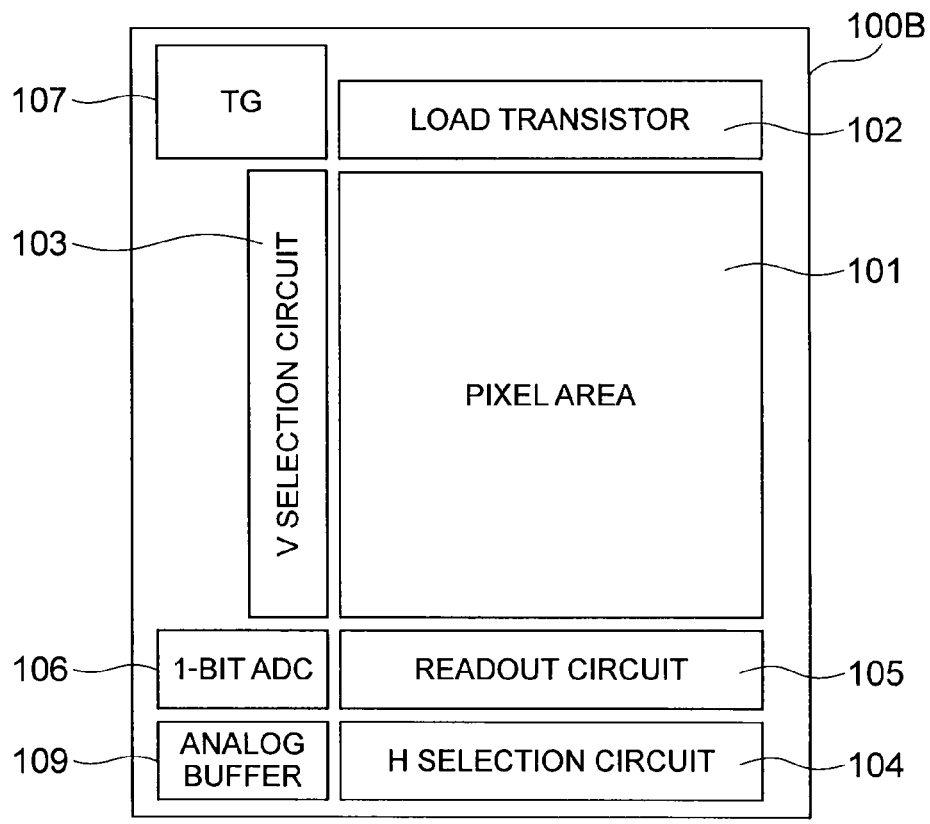
FIG. 16 is a block diagram showing a two-dimensional digital data acquisition element according to a third embodiment.

A schematic configuration of a two-dimensional digital data acquisition element according to a third embodiment of the present invention is shown in FIG. 16. A two-dimensional digital data acquisition element 100B according to the present embodiment has a configuration obtained from the two-dimensional digital data acquisition element 100 according to the first embodiment shown in FIG. 1 by newly providing an analog buffer circuit 109 and inputting the output of the readout circuit 105 to not only the 1-bit ADC 106 but also the analog buffer circuit 109.

Figure 17:
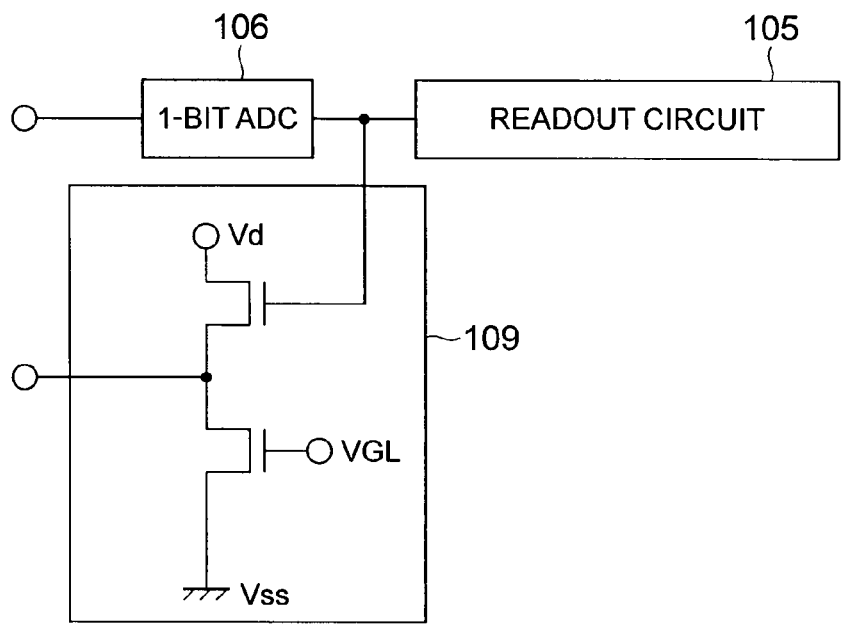
FIG. 17 is a block diagram showing an analog buffer circuit according to a third embodiment.

According to the two-dimensional digital data acquisition element 100B according to the present embodiment, it is possible to obtain not only the 1-bit digital output but also the analog output from the pixel, optimize the operation of the 1-bit ADC 106 by using the analog output, and obtain an ultra-fast two-dimensional digital data acquisition element. As for the analog buffer circuit 109, for example, a source follower circuit shown in FIG. 17 can be used as a buffer circuit having high input impedance.

Hereafter, optimization of the operation of the 1-bit ADC 106 in the two-dimensional digital data acquisition element 100B according to the present embodiment will be described.

Extraction of the high-data area in the two-dimensional digital data has been described with reference to the first embodiment and the second embodiment. The pixel output generated in the high-data area changes according to the light intensity of the light source used to form the two-dimensional digital data. For example, in the holographic storage apparatus, an optical disk serving as a medium is irradiated with a reference beam from a short wavelength laser light source having a wavelength of approximately 400 nm in order to obtain a holographic image which is two-dimensional digital data. It is considered that since the light intensity of the laser light source changes with time, the illuminance in the high-data area in the two-dimensional digital data changes, and consequently the pixel output generated in the high-data area changes. Or it is considered that since the optical loss in the optical path changes according to the state of the optical disk serving as the medium, the illuminance of the high-data area in the two-dimensional digital data changes in the same way and consequently the pixel output generated in the high-data area changes. In these cases, it is possible to optimize the operation of the 1-bit ADC 106 by adjusting the threshold voltage Vth of the 1-bit ADC 106.

In the two-dimensional digital data acquisition element 100B according to the present embodiment, the analog output can be obtained via the analog buffer circuit 109. Therefore, it is possible to adjust the threshold voltage Vth of the 1-bit ADC 106 and optimize the operation by utilizing the analog output.

When acquiring two-dimensional digital data, an optical disk serving as a medium is set in the device.

It is possible to optimize the operation of the 1-bit ADC 106 by reading out the high-data analog output corresponding to at least one frame into the external circuit whenever setting the optical disk, knowing the pixel output generated in the high-data area on the basis of the high-data analog output data corresponding to at least one frame, and adjusting the threshold voltage Vth of the 1-bit ADC 106 on the basis of the value of the pixel output. For example, as the simplest method, there is a method of extracting a maximum analog output Vmax from the analog output data corresponding to one frame and setting the threshold voltage Vth of the 1-bit ADC 106 so as to make it equal to Vmax/2. Especially when a CMOS inverter circuit is used as the 1-bit ADC 106 as shown in FIGS. 9A and 9B, the threshold voltage Vth of the 1-bit ADC 106 can be set equal to Vmax/2 by giving the same voltage as Vmax to VDL. That is because the threshold voltage Vth of the CMOS inverter circuit satisfies the relation Vth=VDL/2 if the following conditions are satisfied with respect to the nMOS transistor and the pMOS transistor included in the CMOS inverter circuit.

$\beta n = \beta p$ $Vthn = -Vthp$

Where $\beta n = \mu n \cdot Cox \cdot (Weffn/Leffn)$ $\beta p = \mu p \cdot Cox \cdot (Weffp/Leffp)$ Here, μn is an electron mobility, μp is a hole mobility, Cox is a capacitance of a gate oxide film per unit area, Weffn is an effective channel width of the nMOS transistor, Weffp is an effective channel width of the pMOS transistor, Leffn is an effective channel length of the nMOS transistor, and Leffp is an effective channel length of the pMOS transistor.

This condition can be satisfied by a suitable design of the channel impurity concentration and channel size.

Even if this condition is not satisfied, the threshold voltage Vth of the CMOS inverter can be set to any value by controlling VDL. In that case, therefore, VDL should be set so as to satisfy the relation Vth=Vmax/2.

As heretofore described, the operation of the 1-bit ADC can be optimized on the basis of the analog output information.

By the way, it is also possible to optimize the operation of the 1-bit ADC every pixel by knowing the pixel output generated in the high-data area on the basis of high-data analog output data corresponding to one frame and adjusting Vth of the 1-bit ADC every pixel on the basis of the value of the pixel output. In this case, high-data analog output data corresponding to one frame should be retained in an external frame memory 301 shown in FIG. 18 and the high-data analog output data retained in the external frame memory 301 should be supplied as VDL of the ADC so as to be synchronized with the ADC operation of the pertinent pixel.

If the relation Vth=VDL/2 is not satisfied, it is possible to provide $VDL_i$ satisfying the relation $Vth_i=VHD_i/2$ by conducting suitable conversion processing on the high-data analog output data $VHD_i$. Here, the subscript i means data every pixel.

Figure 18:
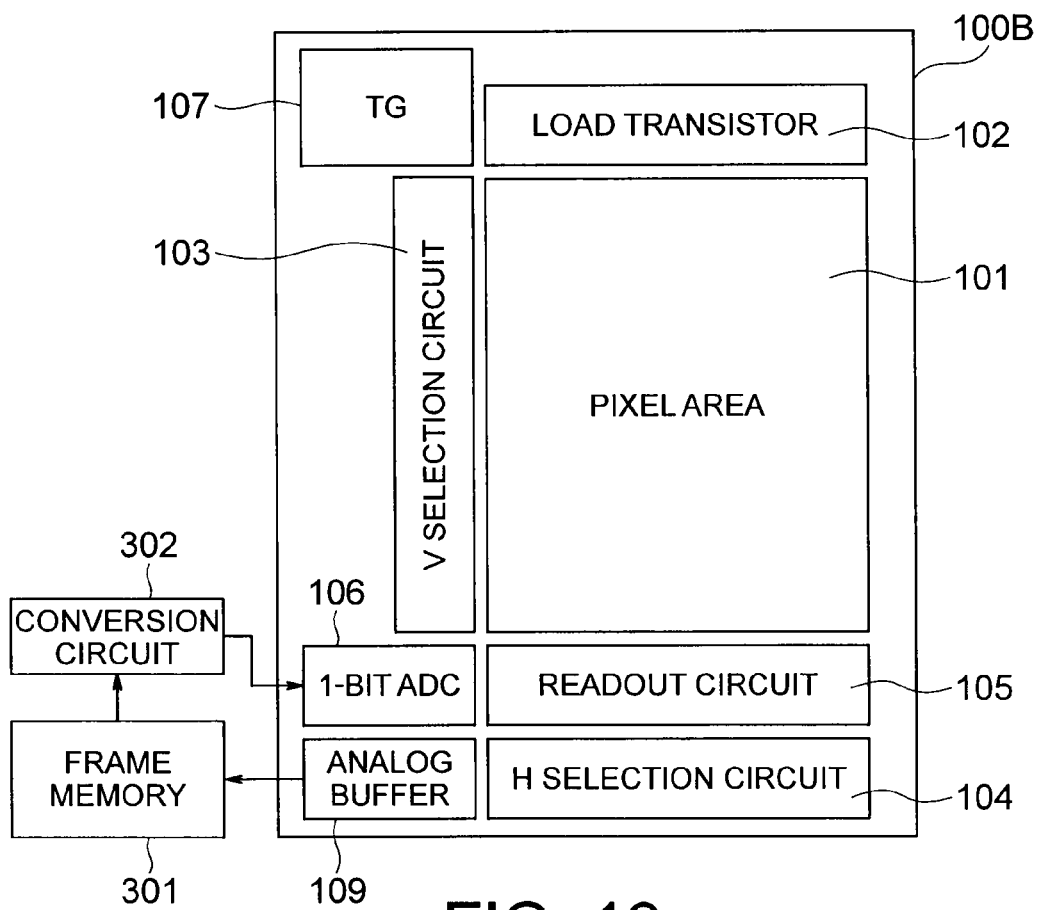
FIG. 18 is a block diagram showing a configuration in the case where Vth of a 1-bit ADC is controlled for every pixel.
Figure 19:
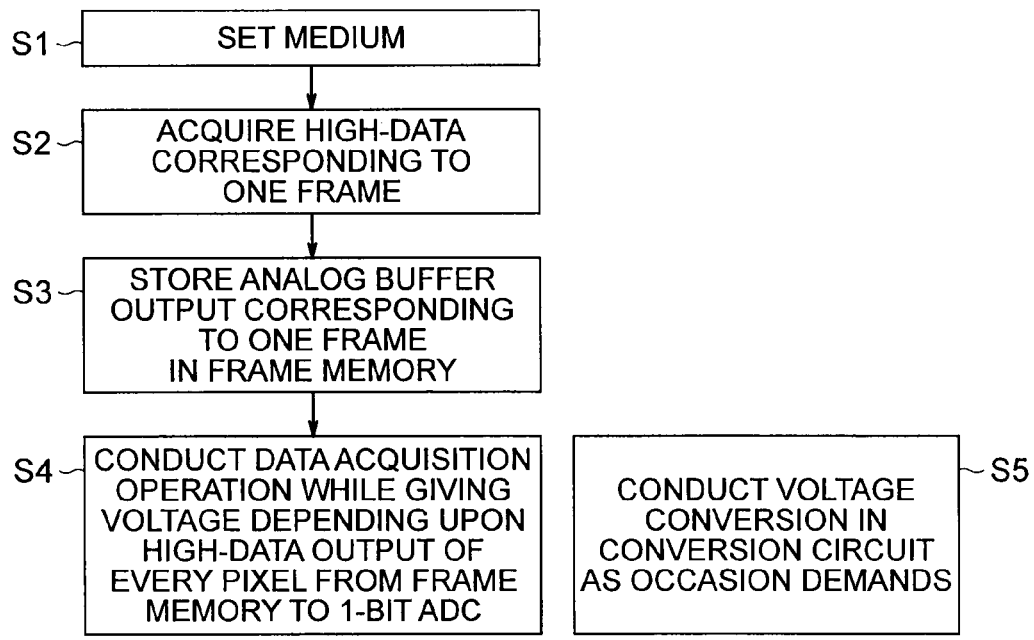
FIG. 19 is a diagram showing an operation flow in the case where Vth of the 1-bit ADC is controlled for every pixel.

A device configuration and its operation flow in the case where the threshold voltage Vth of the 1-bit ADC 106 is adjusted every pixel are shown in FIG. 18 and FIG. 19. First, a medium is set (step S1 in FIG. 19). Thereafter, one frame high-data is acquired by using the data acquisition element 100B according to the present embodiment (step S2 in FIG. 19). Subsequently, the output of the analog buffer circuit 109 corresponding to one frame is stored in the frame memory 301 (step S3 in FIG. 19). And data acquisition operation is conducted while providing the 1-bit ADC 106 with a voltage depending upon the high-data output supplied from the frame memory 301 every pixel (step S4 in FIG. 19). At this time, voltage conversion is conducted in an external conversion circuit 302 as occasion demands (step S5 in FIG. 19).

In the above-described method of extracting the maximum analog output Vmax from the analog output data corresponding to one frame and setting the threshold voltage Vth of the 1-bit ADC 106 so as to set it equal to Vmax/2, which is the simplest method, the operation flow is also the same as FIG. 19. In that case, it is possible to extract Vmax in the conversion circuit 302 shown in FIG. 18. It is also possible to terminate the following frame memory operation by retaining and storing Vmax in the conversion circuit 302.

This analog output is used only for the purpose of optimizing the operation of the 1-bit ADC. Therefore, it is also possible to stop the operation of the analog buffer circuit 109 at the time of digital output by conducting pulse drive of a power supply voltage VD of the source follower circuit shown in FIG. 17 or conducting pulse drive of a gate voltage VGL of a load transistor. It can be said that stopping of the operation is desirable for suppressing the power dissipation.

As described with reference to the first embodiment and the second embodiment, the readout circuit 105 is typically provided with a multi-line output for the purpose of ultra-fast readout. For example, the output data rate can be increased to ten times while maintaining the same clock frequency by providing the readout circuit 105 with a 10-line output. In that case, it can be coped with by disposing as many analog buffer circuits as the readout lines for multi-line readout. In that case, as many analog output pins as digital output pins are needed.

Alternatively if it is not necessary to obtain the analog output and the 1-bit digital output simultaneously, it is also possible to cause the analog signals and the digital signals to share the output pins and use the output pins by changing over the analog signals and the digital signals by means of switches. In that case, the output pins do not increase and it can be said that the scheme is more desirable.

It is also possible to implement the present embodiment in combination with the second embodiment shown in FIG. 11.

According to the present embodiment, it is possible to adjust the threshold voltage Vth of the 1-bit ADC 106 on the basis of a result obtained by conducting operation on the analog output data and to optimize the operation. Thus, it is possible to obtain a two-dimensional digital data acquisition element and a two-dimensional digital data acquisition apparatus which are ultra-high in speed and which can read data stably even if a luminance change is caused in two-dimensional digital data by a variation in the light source power or a change in the medium state.

Furthermore, the same effects as those in the first embodiment or the second embodiment can also be obtained.

Fourth Embodiment

Figure 20:
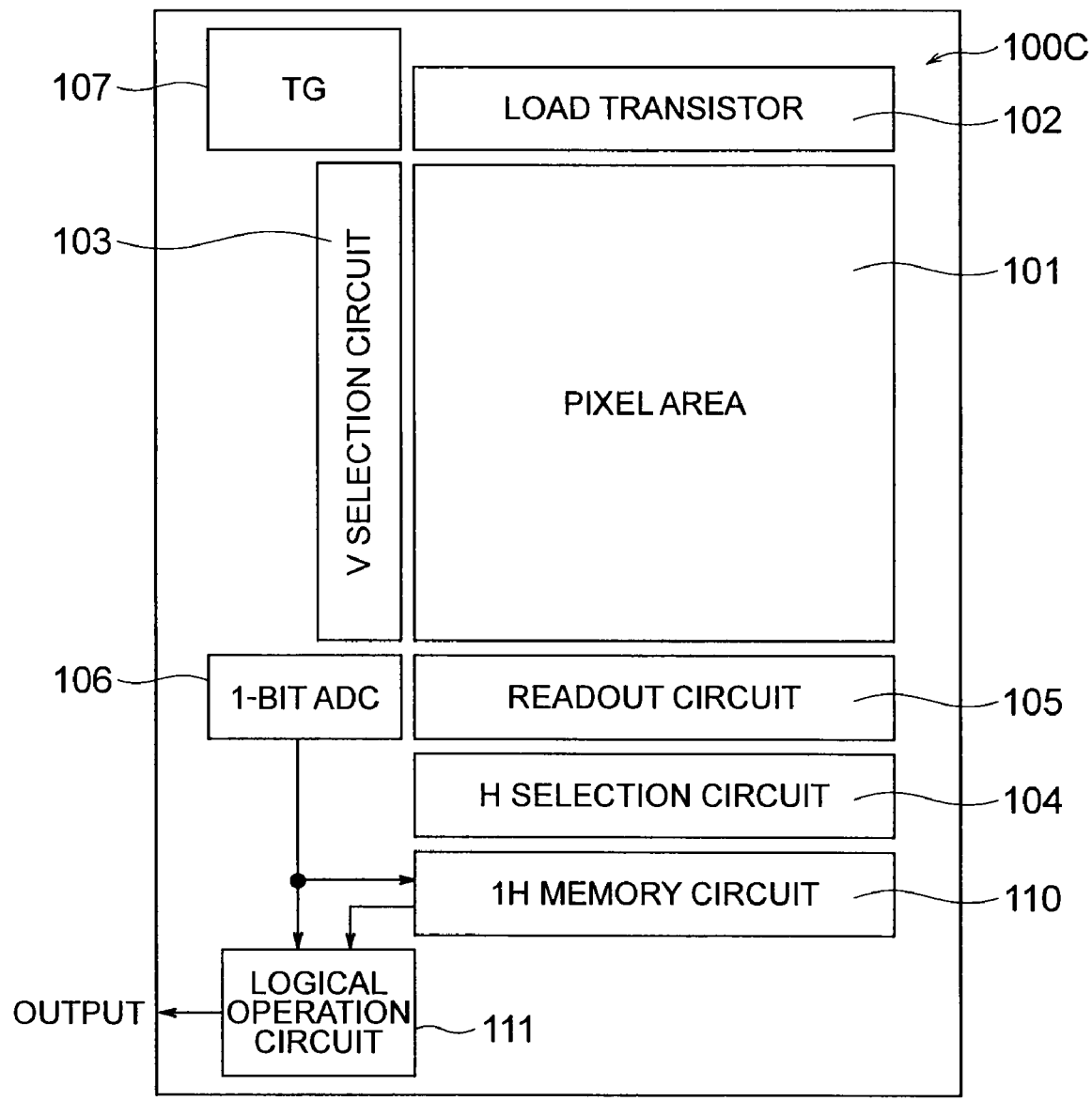
FIG. 20 is a block diagram showing a two-dimensional digital data acquisition element according to a fourth embodiment.

A schematic configuration of a two-dimensional digital data acquisition element according to a fourth embodiment of the present invention is shown in FIG. 20. A two-dimensional digital data acquisition element 100C according to the present embodiment has a configuration obtained from the two-dimensional digital data acquisition element 100 according to the first embodiment shown in FIG. 1 by newly providing a 1H memory circuit 110 and a logical operation circuit 111.

The 1H memory circuit 110 includes two memories: first and second 1H memories (not illustrated), and a copy part (not illustrated) which copies data between the first and second 1H memories. In the first and second 1H memories, the same column is selected by the H selection circuit.

Operation of the 1H memory circuit 110 and the logical operation circuit 111 will now be described.

Step 1: An output of the 1-bit ADC 106 which is head column data is stored in the first 1H memory.

Step 2: Data stored in the first 1H memory is copied to the second 1H memory and stored therein.

Step 3: An output of the 1-bit ADC 106 which is the next column data is stored in the first 1H memory.

Step 4: While conducting logical operation successively on the output of the preceding row output from the second 1H memory in synchronism with the output of the 1-bit ADC 106 and the output of the 1-bit ADC 106, the logical operation circuit 111 outputs operation results "in the column" in time series in parallel with the storage operation conducted at the step 3.

Step 5: Data from the first 1H memory are copied to the second 1H memory.

Step 6: Steps 3 to 5 are repeated until data run out.

In the two-dimensional digital data acquisition element according to the present embodiment having such a configuration, the logical operation processing function between pixels adjacent in the vertical direction is implemented on the chip besides the logical operation processing between pixels adjacent in the horizontal direction. Operation processing in the external circuit can be remarkably reduced as compared with the first embodiment. As compared with the first embodiment, remarkable reduction of the external circuit in size and cost becomes possible.

Although only one 1-bit ADC 106 is provided in the present embodiment, a plurality of 1-bit ADCs 106 may be provided, for example, as shown in FIG. 10 as a multilane readout structure. In this case, it is necessary to provide the 1H memory circuits 110 and the logical operation circuits 111 as well according to the number of the 1-bit ADCs 106.

Fifth Embodiment

Figure 21:
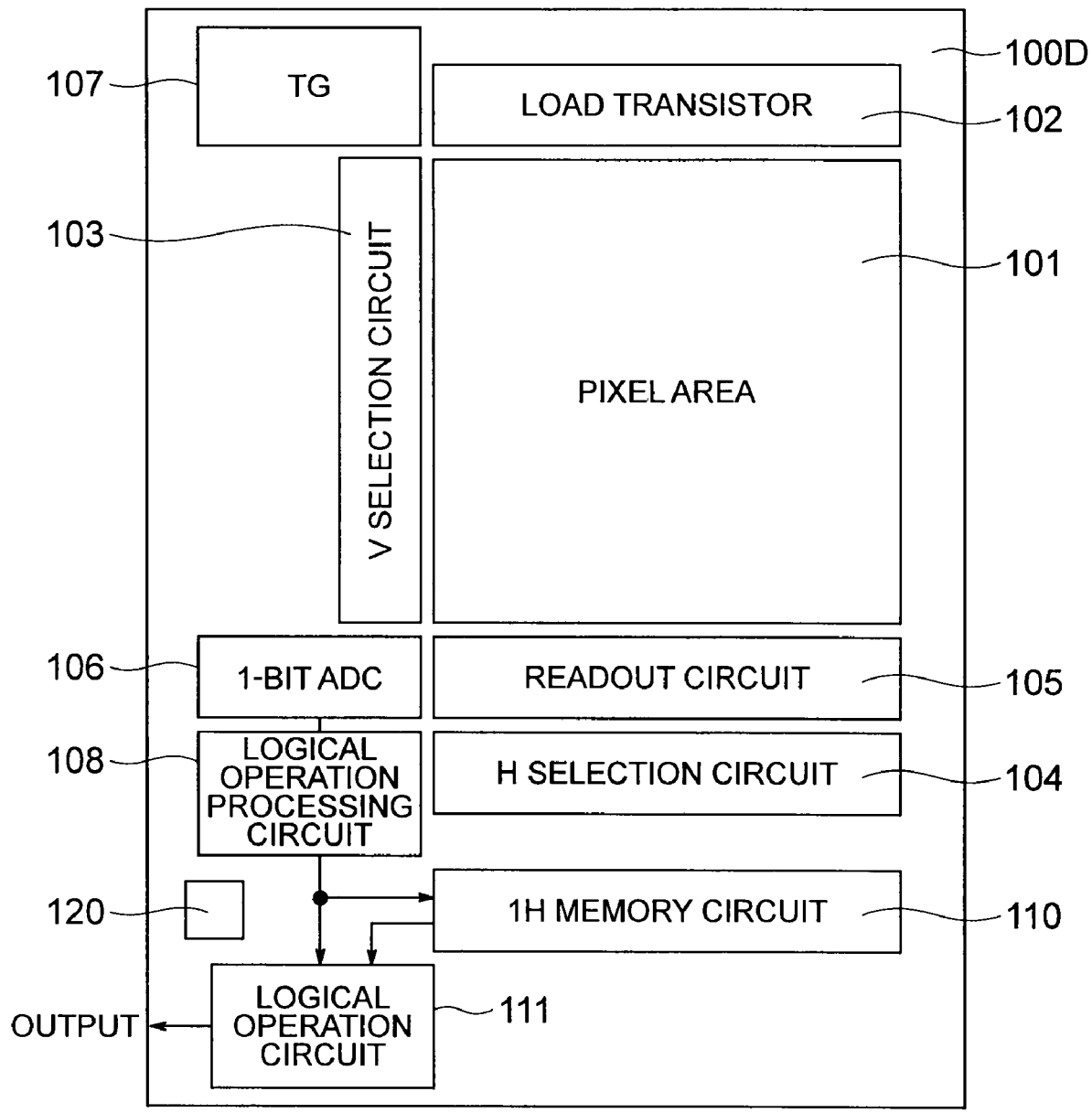
FIG. 21 is a block diagram showing a two-dimensional digital data acquisition element according to a fifth embodiment.

A schematic configuration of a two-dimensional digital data acquisition element according to a fifth embodiment of the present invention is shown in FIG. 21. A two-dimensional digital data acquisition element 100D according to the present embodiment has a configuration obtained from the two-dimensional digital data acquisition element 100A according to the second embodiment shown in FIG. 11 by newly providing a 1H memory circuit 110 and a logical operation circuit 111.

The 1H memory circuit 110 includes two memories: first and second 1H memories (not illustrated), and a copy part (not illustrated) which copies data between the first and second 1H memories. In the first and second 1H memories, the same column is selected by the H selection circuit.

Operation of the 1H memory circuit 110 and the logical operation circuit 111 will now be described.

Step 1: An output of the inter-pixel-data operation processing circuit 108 which is head column data is stored in the first 1H memory.

Step 2: Data stored in the first 1H memory is copied to the second 1H memory and stored therein.

Step 3: An output of the inter-pixel-data operation processing circuit 108 which is the next column data is stored in the first 1H memory.

Step 4: While conducting logical operation successively on the output of the preceding row output from the second 1H memory in synchronism with the output of the inter-pixel-data operation processing circuit 108 and the output of the inter-pixel-data operation processing circuit 108, the logical operation circuit 111 outputs operation results "in the column" in time series in parallel with the storage operation conducted at the step 3.

Step 5: Data from the first 1H memory are copied to the second 1H memory.

Step 6: Steps 3 to 5 are repeated until data run out.

In the two-dimensional digital data acquisition element according to the present embodiment having such a configuration, the logical operation processing function between pixels adjacent in the vertical direction is implemented on the chip besides the logical operation processing between pixels adjacent in the horizontal direction. Operation processing in the external circuit can be remarkably reduced. As compared with the second embodiment, remarkable reduction of the external circuit in size and cost becomes possible.

Although only one 1-bit ADC 106 is provided in the present embodiment, a plurality of 1-bit ADCs 106 may be provided, for example, as shown in FIG. 10. In this case, it is necessary to provide the inter-pixel-data operation processing circuits 108, the 1H memory circuits 110 and the logical operation circuits 111 as well according to the number of the 1-bit ADCs 106.

Sixth Embodiment

A drive method of the two-dimensional digital data acquisition element according to a sixth embodiment will now be described. The drive method according to the present embodiment is used to drive the two-dimensional digital data acquisition element according to any one of the first to fifth embodiments. A drive timing chart of the drive method is shown in FIG. 22.

Figure 22:
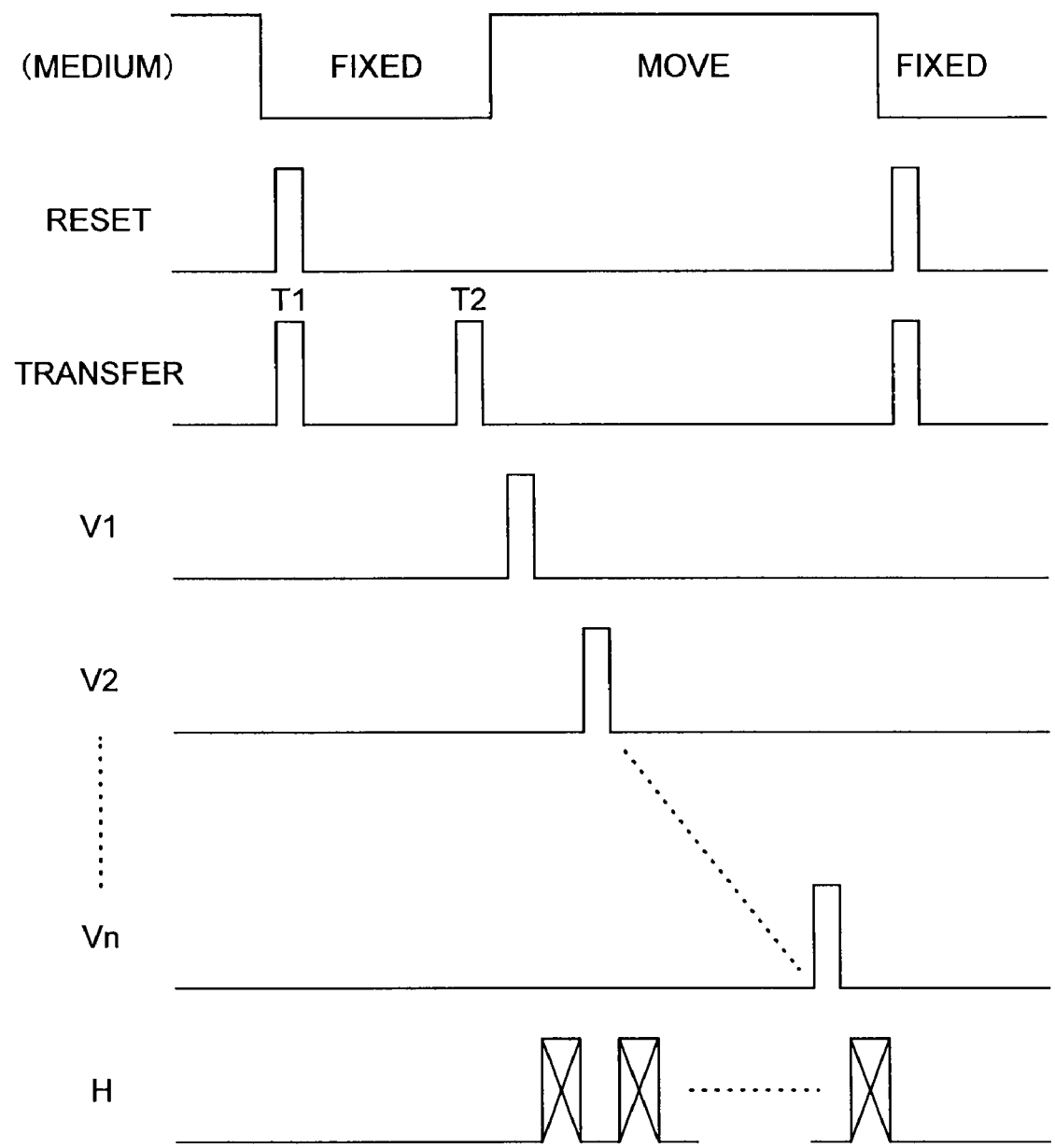
FIG. 22 is a timing chart for explaining a drive method for a two-dimensional digital data acquisition element according to a sixth embodiment.

A feature of the timing chart shown in FIG. 22 is that the transfer transistors 202 are controlled simultaneously in all pixels. Its object is to acquire two-dimensional digital data simultaneously in all pixels.

In general, the CMOS sensor readout operation is executed by taking a row as the unit. For the purpose of removing noise inherent in pixels in the CDS circuit, dark time signal readout in a state in which the detection node is reset and bright time signal readout in a state in which signal charge is transferred from the photodiode to the detection node are conducted at that time.

As a result, a time zone in which the signal charge is stored in the photodiode, i.e., the time in which the signal charge is stored in the photodiode differs from row to row.

In the ultra-fast two-dimensional digital data acquisition apparatus such as the holographic storage apparatus, fast readout can be implemented efficiently by reading two-dimensional digital data simultaneously in all pixels, moving a medium such as an optical disk by use of the subsequent data readout period and forming the next two-dimensional digital data.

As shown in FIG. 22, the transfer transistor 202 is turned on in all pixels simultaneously and signal charge stored in the photodiode 201 is transferred to the detection node 203 in all pixels simultaneously. This corresponds to the above-described efficient fast readout operation. Operation of the element will now be described with reference to FIG. 22.

First, in a state in which the medium is fixed, the transfer transistor 202 and the reset transistor 204 are turned on in all pixels simultaneously to reset the photodiode 201 and the detection node 203 in all pixels (time T1).

After a definite time has elapsed, the transfer transistor 202 is turned on in all pixels simultaneously to transfer the signal charge stored in the photodiode 201 to the detection node 203 in all pixels simultaneously (time T2). A time period (T2−T1) becomes the so-called storage time period. During this time period, the medium such as the optical disk is fixed so as to prevent the two-dimensional digital data from being changed.

After the transfer of the signal charge is completed, the medium such as the optical disk is moved and preparation for generating the next two-dimensional digital data is conducted.

The signal charge transferred to the detection node 203 is converted to a voltage on the signal line 207 by row selection pulses V1, V2, . . . , Vn. A signal line voltage generated by the row selection pulse V1 is read out into the readout circuit 105 in response to an H selection pulse output from the H selection circuit 104.

In the wake of the trailing edge of the H selection pulse, a new signal line voltage is generated by the next row selection pulse V2. The new signal line voltage is read out into the readout circuit in response to an H selection pulse output from the H selection circuit 104. Hereafter, the operation is repeated until the signal readout of the final row is completed.

After all signal readout is completed, the transfer transistor 202 and the reset transistor 204 are turned on in all pixels simultaneously, and the photodiode 201 and the detection node 203 are reset in all pixels.

Until this reset operation is conducted, movement of the medium such as the optical disk is completed and the next two-dimensional digital data is generated.

According to the drive method according to the present embodiment, it is possible to shorten a time period required for fixing the medium such as the optical disk to form two-dimensional digital data by conducting integral operation in all pixels simultaneously. During the time period over which signal charges transferred to the detection node are read out successively, the medium such as the optical disk can be moved and preparation for forming the next two-dimensional digital data can be conducted. As a result, it becomes possible to conduct ultra-fast two-dimensional digital data readout efficiently.

In addition, it is also possible to provide a CDS circuit between the pixel area 101 and the readout circuit 105 as occasion demands, reset a detection node in a pertinent row after reading out detection node information in each row onto a signal line, and obtain a difference between a signal line output containing detection node information and a signal line output in a state with the detection node reset. In this case, kTC noise caused by resetting the detection node cannot be removed. However, noise inherent in the pixel caused by the threshold variation of the amplification transistor in the pixel can be removed.

Seventh Embodiment

Figure 23:
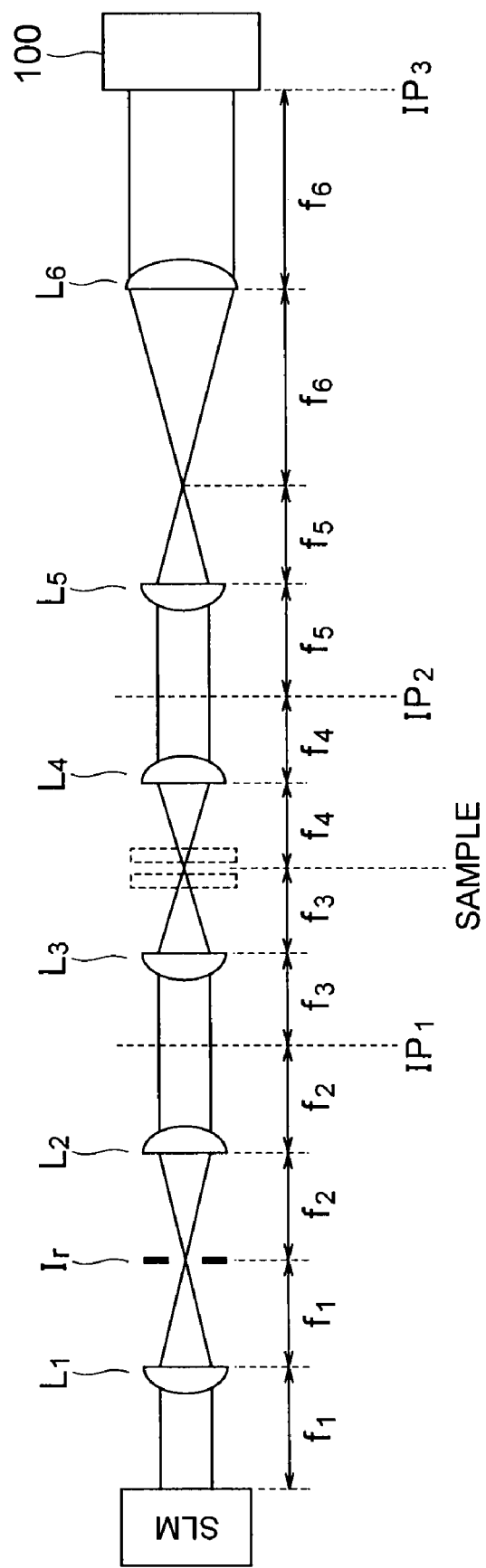
FIG. 23 is a diagram showing a holographic storage according to a seventh embodiment.

A holographic storage apparatus according to a seventh embodiment of the present invention is shown in FIG. 23. FIG. 23 is a schematic diagram showing an optical system in the range from a spatial light modulator SLM to the two-dimensional digital data acquisition element.

In the holographic storage apparatus according to the present embodiment, the two-dimensional digital data acquisition element 100 according to the first embodiment is used as a pickup element (image pickup element). Alternatively, the two-dimensional digital data acquisition element according to any of the second to sixth embodiments may be used as the pickup element.

An optical system of the holographic storage apparatus according to the present embodiment includes six lenses $L_1$ to $L_6$ and an iris Ire disposed between the lens $L_1$ and $L_2$. Each lens $L_i$ (i=1, ..., 6) has a focal length $i_f$.

An image of two-dimensional data displayed on the spatial light modulator SLM is formed on the two-dimensional digital data acquisition element 100 disposed in an image forming position $IP_3$ via image forming positions $IP_1$ and $IP_2$. The iris Ire is provided to remove high-order refracted light generated from the spatial light modulator SLM. An expansion factor of the image formed in the image forming position $IP_1$ to the image displayed on the spatial light modulator SLM is given by $f_2/f_1$. Considering expansion factors in the image forming positions $IP_1$, $IP_2$ and $IP_3$ in order in the same way, finally an expansion factor of the image formed on the two-dimensional digital data acquisition element 100 to the image displayed on the spatial light modulator SLM is given by $(f_2/f_1) \cdot (f_4/f_3) \cdot (f_6/f_5)$. In the present embodiment, lenses $L_1$ to $L_6$ having $f_1=f_2=50$ mm, $f_3=f_4=40$ mm, $f_5=70$ mm and $f_6=120$ mm are used. Therefore, the expansion factor becomes 120/70=1.71. Since the pixel pitch on the spatial light modulator SLM is 13.68 µm, each pixel on the spatial light modulator SLM occupies 13.68×120/70=23.45 µm on the two-dimensional digital data acquisition element 100. On the other hand, since the pixel pitch in the pixel area 101 of the two-dimensional digital data acquisition element 100 is the pixel pitch 8 µm of the CMOS sensor element, the oversampling rate (the ratio of the pixel pitch to the unit data area pitch in the two-dimensional digital image: n) is approximately 3 (=23.45/8).

The holographic storage apparatus shown in FIG. 23 uses the so-called transmission hologram scheme, and has a structure in which two-dimensional digital data light is transmitted through a sample (transmission type hologram) disposed between the lenses $L_3$ and $L_4$. The present embodiment is not restricted to the structure shown in FIG. 23, but it may be a holographic storage apparatus of the so-called reflection type hologram scheme. In other words, instead of the structure in which two-dimensional digital data light transmits through the sample as shown in FIG. 23, a structure in which two-dimensional digital data light is reflected by a sample (reflection type hologram) may be used.

Since the two-dimensional digital data acquisition element according to the first embodiment is used as the pickup element, the holographic storage apparatus according to the present embodiment can be made ultra-fast in speed, small in size, and low in price.

As heretofore described, the two-dimensional digital data acquisition element according to an embodiment of the present invention uses 1-bit AD conversion in the output part and outputs the 1-bit digital signal. Furthermore, the two-dimensional digital data acquisition element outputs a result obtained by conducting the operation processing of the 1-bit digital signal between adjacent pixels. In addition, it is also possible to output an analog signal via an analog buffer, and it is possible to adjust the threshold of the 1-bit ADC on the basis of the analog output. And the time required to fix the medium containing the two-dimensional digital data can be remarkably shortened and efficient fast readout is made possible by resetting the photodiode and conducting signal charge transfer from the photodiode in all pixels simultaneously.

Therefore, an ultra-fast two-dimensional digital data acquisition element can be obtained by using a simple device configuration based on the CMOS sensor element having a standard pixel configuration. Thus, a smaller size and a lower cost can be attained. In addition, if multi-line readout is conducted for fast operation and the number of readout lines is K, then M×K output pins are needed in the conventional M-bit output element. On the other hand, K output pins are sufficient in the present invention, and not only the chip cost but also the package cost can be remarkably reduced. In addition, since the output is the 1-bit digital output, the two-dimensional digital data reconstruction process using the external circuit is remarkably simplified and a remarkable reduction in size and cost of the ultra-fast two-dimensional digital data acquisition apparatus becomes possible. Furthermore, even if there is an output variation of the laser light source, accurate data acquisition can be conducted by adjusting the threshold of the 1-bit ADC.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A two-dimensional digital data acquisition element which applies light to an optical information recording medium having a plurality of unit data areas each formed of one encoded data and having two-dimensional digital image information recorded thereon, and acquires two-dimensional digital data reproducing the two-dimensional digital image information based on reproduced light supplied from the optical information recording medium, the two-dimensional digital data acquisition element comprising:
  a pixel area having a plurality of pixels arranged in a matrix form, each of the pixels having a photoelectric conversion element to convert the reproduced light from the optical information recording medium to an electric signal;
  selection circuits which select the pixel;
  a readout circuit which reads out an electric signal of a pixel selected by the selection circuits; and
  a 1-bit AD converter which converts an output of the readout circuit to 1-bit digital data,
  wherein
  a pitch ratio N between a pitch P1 of the unit data areas in the two-dimensional digital image information and a pitch P2 of the pixels in the pixel area defined as N=P1/P2 satisfies a relation $$A \cdot n^2/(An+1) < N < A \cdot n^2/(An-1)$$

where A is the number of digital data in one-dimensional direction of one byte of the two-dimensional digital data and n is a natural number of at least 2.

2. The element according to claim 1, wherein
  the 1-bit digital data is digital data of a row unit corresponding to pixels in one row direction of the pixels arranged in the matrix form,
  the two-dimensional digital data acquisition element comprises a row memory to retain the digital data of the row unit over a definite time period, and a first logical operation circuit to conduct logical operation of every same column, between row unit digital data of two rows adjacent in the same column direction, and
  an output of the first logical operation circuit is output to outside.

3. The element according to claim 1, further comprising an operation processing circuit, wherein
  the operation processing circuit comprises:
  a delay circuit which delays an output of the 1-bit AD converter; and
  a second logical operation circuit which conducts logical operation on the basis of the output of the 1-bit AD converter and an output of the delay circuit.

4. The element according to claim 3, wherein
  the n has a value of at least 3, and
  the second logical operation circuit included in the operation processing circuit is an AND circuit.

5. The element according to claim 1, wherein a threshold voltage of the 1-bit AD converter can be controlled.

6. The element according to claim 1, further comprising an analog buffer circuit which receives the output of the readout circuit and outputs analog data.

7. The element according to claim 6, wherein
  the analog data corresponding to at least one frame is stored, and
  a threshold voltage of the 1-bit AD converter is controlled every pixel on the basis of the stored analog data group.

8. The element according to claim 6, wherein
  the analog data corresponding to at least one frame is stored, and
  a threshold voltage of the 1-bit AD converter is controlled on the basis of a value obtained by conducting operation processing on the stored analog data group.

9. The element according to claim 8, wherein
  a maximum analog output is extracted from the stored analog data group, and
  control is exercised so as to make the threshold voltage of the 1-bit AD converter equal to half of the maximum analog output.

10. The element according to claim 7, wherein storage of the analog data corresponding to one frame required for controlling the threshold voltage of the 1-bit AD converter is executed each time the optical information recording medium having the two-dimensional digital image information recorded thereon is set.

11. The element according to claim 6, wherein the analog buffer circuit is a source follower circuit.

12. The element according to claim 1, wherein the 1-bit AD converter comprises at least one CMOS inverter circuit.

13. The element according to claim 1, wherein each pixel in the pixel area comprises:
  a transfer transistor for transferring signal charge stored in the photoelectric conversion element to a detection node;
  a reset transistor for resetting a potential at the detection node;
  an amplification transistor connected at a gate thereof to the detection node; and
  a selection transistor for selecting the pixel according to a signal supplied from the selection circuit,
  wherein the transfer transistor is controlled in all pixels included in the pixel area simultaneously.

14. A holographic storage apparatus comprising the two-dimensional digital data acquisition element according to claim 1 as a pickup element.

* * * * *